(12) United States Patent
Kamabuchi et al.

(10) Patent No.: US 7,135,268 B2
(45) Date of Patent: Nov. 14, 2006

(54) AMPLIFICATION TYPE POSITIVE RESIST COMPOSITION

(75) Inventors: Akira Kamabuchi, Ashiya (JP); Yasunori Uetani, Tsukuba (JP); Hiroshi Moriuma, Toyonaka (JP)

(73) Assignee: Sumitomo Chemical Company, Limited, Osaka (JP)

( * ) Notice: Subject to any disclaimer, the term of this patent is extended or adjusted under 35 U.S.C. 154(b) by 113 days.

(21) Appl. No.: 10/440,201

(22) Filed: May 19, 2003

(65) Prior Publication Data
US 2004/0029037 A1 Feb. 12, 2004

(30) Foreign Application Priority Data
May 21, 2002 (JP) ............................ 2002-145866
Jul. 23, 2002 (JP) ............................ 2002-213647

(51) Int. Cl.
G03F 7/004 (2006.01)
(52) U.S. Cl. ............................... 430/270.1; 430/286.1; 430/581.1; 430/905; 430/910; 430/913; 430/914; 430/919; 562/45
(58) Field of Classification Search ............. 430/270.1, 430/286.1, 581.1, 905, 910, 913, 914, 919; 562/45
See application file for complete search history.

(56) References Cited

U.S. PATENT DOCUMENTS

| 6,010,820 A | 1/2000 | Aoai et al. | |
|---|---|---|---|
| 2002/0058200 A1 | 5/2002 | Fujimori et al. | |
| 2002/0077493 A1 | 6/2002 | Ohsawa et al. | |
| 2003/0068573 A1* | 4/2003 | Takata et al. ............ | 430/270.1 |

FOREIGN PATENT DOCUMENTS

| JP | 6-199770 | 7/1994 |
|---|---|---|
| JP | 9-258435 | 10/1997 |
| JP | 2000-53607 A | 2/2000 |

* cited by examiner

Primary Examiner—Barbara L. Gilliam

(74) Attorney, Agent, or Firm—Birch, Stewart, Kolasch & Birch, LLP

(57) ABSTRACT

The present invention provides a sulfonate of the formula (I'):

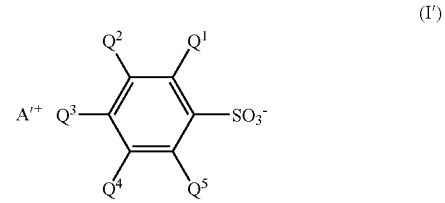

wherein $Q^1$, $Q^2$, $Q^3$, $Q^4$ and $Q^5$ each independently represent hydrogen, alkyl having 1 to 16 carbon atoms, alkoxy having 1 to 16 carbon atoms, or electron attractive group, with the proviso that at least one of $Q^1$, $Q^2$, $Q^3$, $Q^4$ and $Q^5$ represents alkyl having 3 to 16 carbon atoms or alkoxy having 3 to 16 carbon atoms, and at least one of $Q^1$, $Q^2$, $Q^3$, $Q^4$ and $Q^5$ is electron attractive group; and
$A'^+$ represents a counter ion of the formula (IIa), (IIb), (IIc) or (IId) which are identified in the specification.

The present invention also provides a chemical amplification type positive resist composition comprising a sulfonate of the formula (I)

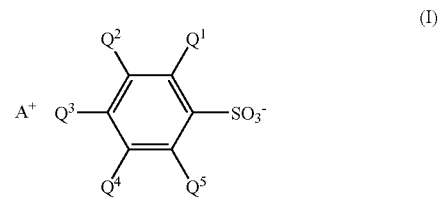

wherein $A^+$ represents counter ion, and $Q^1$, $Q^2$, $Q^3$, $Q^4$ and $Q^5$ are as defined above; and
resin which contains a structural unit having an acid labile group and which itself is insoluble or poorly soluble in an alkali aqueous solution but becomes soluble in an alkali aqueous solution by the action of an acid.

13 Claims, No Drawings

AMPLIFICATION TYPE POSITIVE RESIST COMPOSITION

BACKGROUND OF THE INVENTION

1. Field of the Invention

The present invention relates to a chemical amplification type resist composition used in fine processing of semiconductors and a novel sulfonate.

2. Description of the Related Art

Semiconductor microfabrication employs a lithography process using a resist composition. In lithography, theoretically, the shorter the exposure wavelength becomes, the higher the resolution can be made, as expressed by Rayleigh's diffraction limit formula. The wavelength of an exposure light source for lithography used in the manufacture of semiconductor devices has been shortened year by year as g line having a wavelength of 436 nm, i line having a wavelength of 365 nm, KrF excimer laser having a wavelength of 248 nm and ArF excimer laser having a wavelength of 193 nm. $F_2$ excimer laser having a wavelength of 157 nm seems to be promising as the next-generation exposure light source. Further, as the exposure light source of the subsequent generation, soft X ray (EUV) having a wavelength of 13 nm or shorter has been proposed as the exposure light source following the 157 nm-wavelength $F_2$ excimer laser.

Since light sources having shorter wavelength than that of g line and i line, such as excimer laser and the like have low illumination, it is necessary to enhance the sensitivity of a resist. Consequently, there are used so-called chemical amplification type resists utilizing the catalytic action of an acid produced from a sulfonium salt and the like by exposure and containing a resin having a group being dissociated by this acid.

However, in conventionally known chemical amplification type resist compositions, there is a problem that line edge roughness occurs by generation of standing wave and the like, namely, smoothness on a pattern side wall decreases, and resultantly, uniformity of line width deteriorates.

SUMMARY OF THE INVENTION

An object of the present invention is to provide a novel sulfonate and to provide a chemical amplification type positive resist composition comprising the above-mentioned sulfonate and a resin component, and suitable for excimer laser lithography using ArF, KrF and the like, showing excellent various resist abilities such as sensitivity, resolution and the like, and giving particularly improved line edge roughness.

The present invention relates to the followings:

<1> A chemical amplification type positive resist composition comprising a sulfonate of the formula (I)

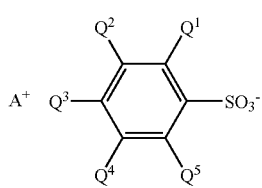

(I)

wherein $Q^1$, $Q^2$, $Q^3$, $Q^4$ and $Q^5$ each independently represent hydrogen, alkyl having 1 to 16 carbon atoms, alkoxy having 1 to 16 carbon atoms, or electron attractive group, and $A^+$ represents counter ion, with the proviso that at least one of $Q^1$, $Q^2$, $Q^3$, $Q^4$ and $Q^5$ represents alkyl having 3 to 16 carbon atoms or alkoxy having 3 to 16 carbon atoms, and at least one of $Q^1$, $Q^2$, $Q^3$, $Q^4$ and $Q^5$ is electron attractive group; and resin which contains a structural unit having an acid labile group and which itself is insoluble or poorly soluble in an alkali aqueous solution but becomes soluble in an alkali aqueous solution by the action of an acid, which is hereinafter referred to as "the present composition".

<2> The composition according to <1> wherein the content of the structural unit having an acid-labile group in all structural units of the resin is from 10 to 80% by mol.

<3> The composition according to <1> or <2> wherein the structural unit having an acid-labile group is a structural unit derived from 2-alkyl-2-adamantyl(meth)acrylate or 1-(1-adamantyl)-1-alkylalkyl(meth)acrylate.

<4> The composition according to any one of <1> to <3> wherein the resin contains, in addition to the structural unit having an acid-labile group, further at least one structural unit selected from the group consisting of a structural unit derived from p-hydroxystyrene, a structural unit derived from m-hydroxystyrene, a structural unit derived from 3-hydroxy-1-adamantyl(meth)acrylate, a structural unit derived from 3,5-dihydroxy-1-adamantyl (meth)acrylate, a structural unit derived from (meth)acryloyloxy-γ-butyrolactone having a lactone ring optionally substituted by alkyl, a structural unit of the formula (VIIa) and a structural unit of the formula (VIIb):

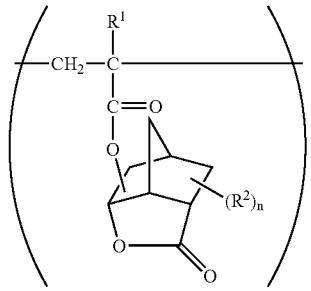

(VIIa)

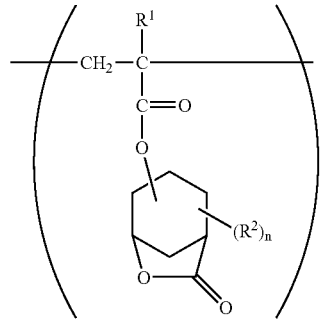

(VIIb)

wherein $R^1$ and $R^2$ each independently represent hydrogen, methyl or trifluoromethyl, and n represents an integer of 1 to 3.

<5> The composition according to any one of <2> to <4> wherein the resin farther contains a structural unit derived from 2-norbornene and a structural unit derived from an aliphatic unsaturated dicarboxylic anhydride.

<6> The composition according to any one of <1> to <5> wherein the composition further comprises basic nitrogen-containing organic compound as a quencher.

<7> The composition according to any one of <1> to <6> wherein the composition further comprises a surfactant.

<8> The composition according to any one of <1> to <7> wherein, in the formula (I), $A^+$ is a counter ion of the formula (IIa), the formula (IIb), the formula (IIc) or the formula (IId):

A counter ion of the formula (IIa)

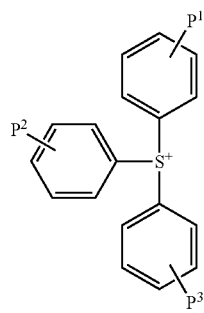
(IIa)

wherein $P^1$, $P^2$ and $P^3$ each independently represent hydrogen, hydroxyl, alkyl having 1 to 6 carbon atoms or alkoxy having 1 to 6 carbon atoms.

A counter ion of the formula (IIb)

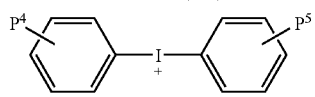
(IIb)

wherein $P^4$ and $P^5$ each independently represent hydrogen, hydroxyl, alkyl having 1 to 6 carbon atoms or alkoxy having 1 to 6 carbon atoms.

A counter ion of the formula (IIc):

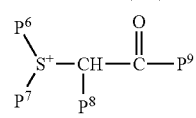
(IIc)

wherein $P^6$ and $P^7$ each independently represent alkyl having 1 to 6 carbon atoms or cycloalkyl having 3 to 10 carbon atoms, or $P^6$ and $P^7$ bond to form alicyclic hydrocarbon group having 3 to 7 carbon atoms together with the adjacent $S^+$ and at least one —$CH_2$— in the alicyclic hydrocarbon group may be substituted by —CO—, —O— or —S—, and $P^8$ represents hydrogen, $P^9$ represents alkyl having 1 to 6 carbon atoms, cycloalkyl group having 3 to 10 carbon atoms or aromatic ring group optionally substituted, or $P^8$ and $P^9$ bond to form 2-oxocycloalkyl group together with the adjacent —CHCO— group.

A counter ion of the formula (IId):

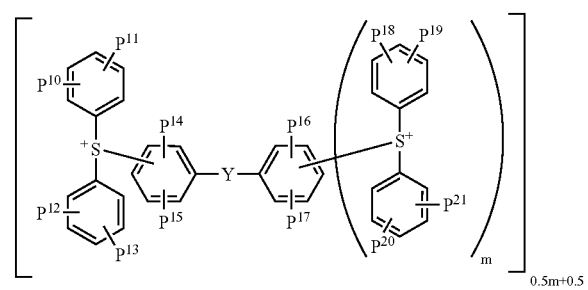
(IId)

wherein $P^{10}$, $P^{11}$, $P^{12}$, $P^{13}$, $P^{14}$, $P^{15}$, $P^{16}$, $P^{17}$, $P^{18}$, $P^{19}$, $P^{20}$ and $P^{21}$ each independently represent hydrogen, hydroxyl, alkyl having 1 to 6 carbon atoms or alkoxy having 1 to 6 carbon atoms, Y represents sulfur or oxygen, and m represents 0 or 1.

<9> A sulfonate of the formula (I'):

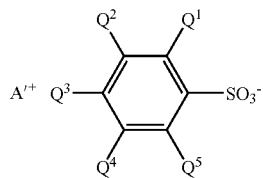
(I')

wherein $Q^1$, $Q^2$, $Q^3$, $Q^4$ and $Q^5$ each independently represent hydrogen, alkyl having 1 to 16 carbon atoms, alkoxy having 1 to 16 carbon atoms, or electron attractive group, with the proviso that at least one of $Q^1$, $Q^2$, $Q^3$, $Q^4$ and $Q^5$ represents alkyl having 3 to 16 carbon atoms or alkoxy having 3 to 16 carbon atoms, and at least one of $Q^1$, $Q^2$, $Q^3$, $Q^4$ and $Q^5$ is electron attractive group; and $A'^+$ represents a counter ion of the formula (IIa)

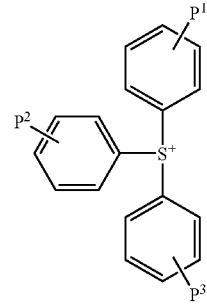
(IIa)

wherein $P^1$, $P^2$ and $P^3$ each independently represent hydrogen, hydroxyl, alkyl having 1 to 6 carbon atoms or alkoxy having 1 to 6 carbon atoms, a counter ion of the formula (IIb)

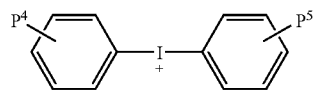
(IIb)

wherein $P^4$ and $P^5$ each independently represent hydrogen, hydroxyl, alkyl having 1 to 6 carbon atoms or alkoxy having 1 to 6 carbon atoms, a counter ion of the formula (IIc)

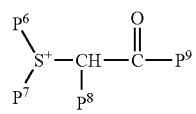
(IIc)

wherein $P^6$ and $P^7$ each independently represent alkyl having 1 to 6 carbon atoms or cycloalkyl having 3 to 10 carbon atoms, or $P^6$ and $P^7$ bond to form alicyclic hydrocarbon group having 3 to 7 carbon atoms together with the adjacent $S^+$ and at least one —$CH_2$— in the alicyclic hydrocarbon group may be substituted by —CO—, —O— or —S—, and $P^8$ represents hydrogen, $P^9$ represents alkyl having 1 to 6 carbon atoms, cycloalkyl group having 3 to 10 carbon atoms or aromatic ring group optionally substituted, or $P^8$ and $P^9$ bond to form 2-oxocycloalkyl group together with the adjacent —CHCO— group, or a counter ion of the formula (IId)

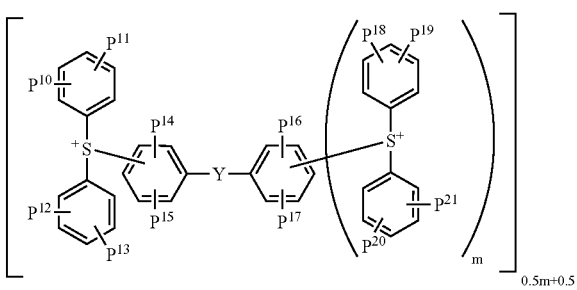

(IId)

wherein $P^{10}$, $P^{11}$, $P^{12}$, $P^{13}$, $P^{14}$, $P^{15}$, $P^{16}$, $P^{17}$, $P^{18}$, $P^{19}$, $P^{20}$ and $P^{21}$ each independently represent hydrogen, hydroxyl, alkyl having 1 to 6 carbon atoms or alkoxy having 1 to 6 carbon atoms, Y represents sulfur or oxygen, and m represents 0 or 1.

<10> The sulfonate according to <9> wherein the sulfonate is a sulfonate of the formula (III'):

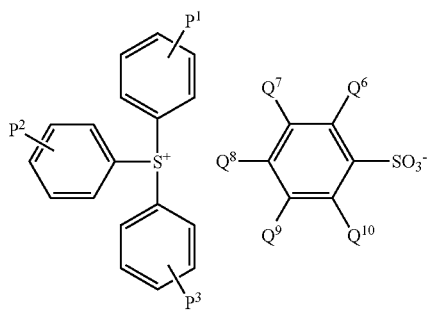

(III')

wherein $Q^6$, $Q^7$, $Q^8$, $Q^9$ and $Q^{10}$ each independently represent hydrogen, alkyl having 1 to 16 carbon atoms, alkoxy having 1 to 16 carbon atoms, or electron attractive group, with the proviso that at least one of $Q^6$, $Q^7$, $Q^8$, $Q^9$ and $Q^{10}$ represents alkyl having 3 to 16 carbon atoms or alkoxy having 3 to 16 carbon atoms, and at least one of $Q^6$, $Q^7$, $Q^8$, $Q^9$ and $Q^{10}$ is nitro group, $P^1$, $P^2$ and $P^3$ are as defined above.

<11> The sulfonate according to <10> wherein the sulfonate is a sulfonate of the formula (IIIa):

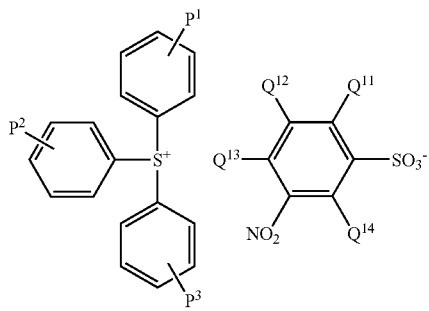

(IIIa)

wherein $Q^{11}$, $Q^{12}$, $Q^{13}$ and $Q^{14}$ each independently represent hydrogen, alkyl having 1 to 16 carbon atoms, alkoxy having 1 to 16 carbon atoms, or electron attractive group, with the proviso that at least one of $Q^{11}$, $Q^{12}$, $Q^{13}$ and $Q^{14}$ represents alkyl having 3 to 16 carbon atoms or alkoxy having 3 to 16 carbon atoms, and $P^1$, $P^2$ and $P^3$ are as defined above.

<12> The sulfonate according to <11> wherein the sulfonate is a sulfonate of the formula (IIIb):

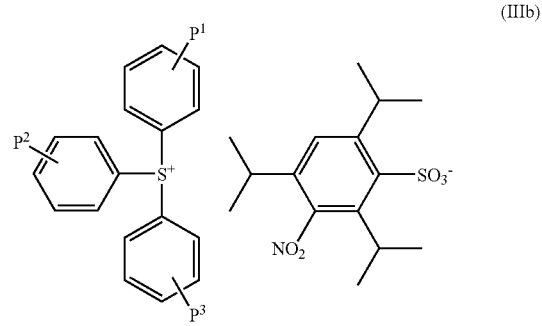

(IIIb)

wherein $P^1$, $P^2$ and $P^3$ are as defined above.

<13> The sulfonate according to <12> wherein $P^1$ and $P^3$ are hydrogen and $P^2$ is 4-methyl.

<14> The sulfonate according to <9> wherein the sulfonate is a sulfonate of the formula (IIIc'):

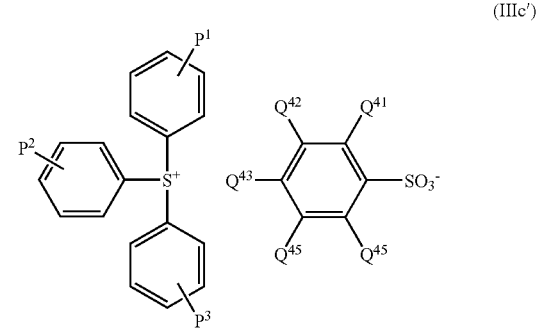

(IIIc')

wherein $Q^{41}$, $Q^{42}$, $Q^{43}$, $Q^{44}$ and $Q^{45}$ each independently represent hydrogen, alkyl having 1 to 16 carbon atoms, alkoxy having 1 to 16 carbon atoms, or electron attractive group, with the proviso that at least one of $Q^{41}$, $Q^{42}$, $Q^{43}$, $Q^{44}$ and $Q^{45}$ represents alkyl group having 3 to 16 carbon atoms or alkoxy having 3 to 16 carbon atoms, and at least two of $Q^{41}$, $Q^{42}$, $Q^{43}$, $Q^{44}$ and $Q^{45}$ are nitro groups, and $P^1$, $P^2$ and $P^3$ are as defined above.

<15> The sulfonate according to <14> wherein the sulfonate is a sulfonate of the formula (IIId):

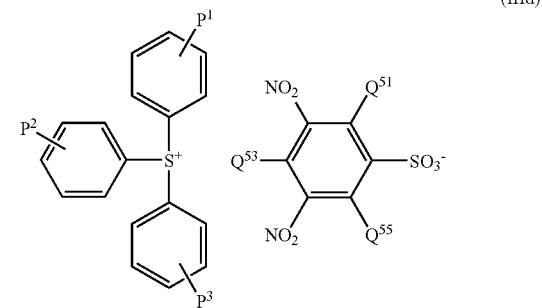

(IIId)

wherein $Q^{51}$, $Q^{53}$ and $Q^{55}$ each independently represent hydrogen, alkyl having 1 to 16 carbon atoms, alkoxy having 1 to 16 carbon atoms, or electron attractive group, with the proviso that at least one of $Q^{51}$, $Q^{53}$ and $Q^{55}$ represents alkyl having 3 to 16 carbon atoms or alkoxy having 3 to 16 carbon atoms, and $P^1$, $P^2$ and $P^3$ are as defined above.

<16> The sulfonate according to <15> wherein the sulfonate is a sulfonate of the formula (IIIe):

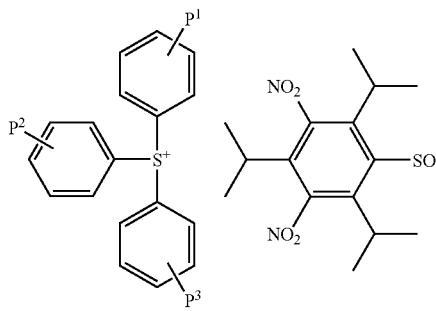

(IIIe)

wherein $P^1$, $P^2$ and $P^3$ are as defined above.

<17> The sulfonate according to <16> wherein $P^1$ and $P^3$ are hydrogen and $P^2$ is 4-methyl.

<18> The sulfonate according to <9> wherein the sulfonate is a sulfonate of the formula (VI'):

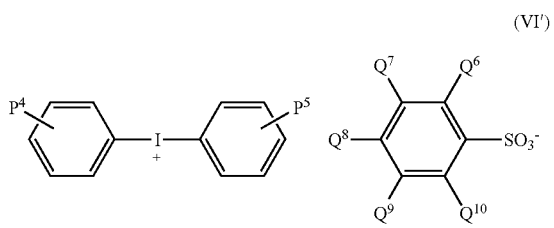

(VI')

wherein $Q^6$, $Q^7$, $Q^8$, $Q^9$, $Q^{10}$, $P^4$ and $P^5$ are as defined above.

<19>. The sulfonate according to <18> wherin the sulfonate is a sulfonate of the formula (VIa):

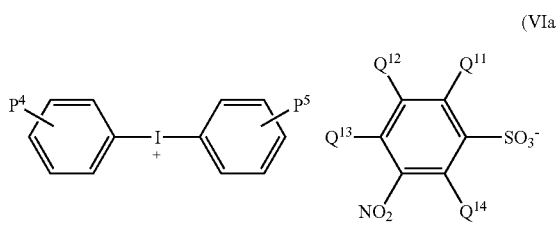

(VIa)

wherein $Q^{11}$, $Q^{12}$, $Q^{13}$, $Q^{14}$, $P^4$ and $P^5$ are as defined above.

<20> The sulfonate according to <19> wherein the sulfonate is a sulfonate of the formula (VIb):

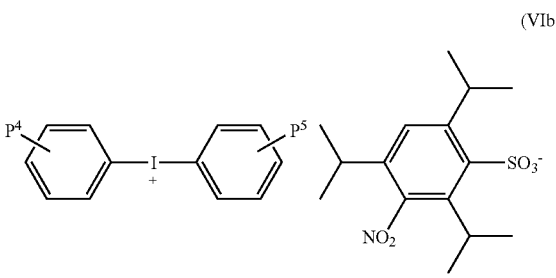

(VIb)

wherein $P^4$ and $P^5$ are as defined above.

<21> The sulfonate according to <20> wherein $P^4$ and $P^5$ are 4-tert.-butyl.

DESCRIPTION OF PREFERRED EMBODIMENTS

The present composition comprises (1) resin which contains a structural unit having an acid labile group and which itself is insoluble or poorly soluble in an alkali aqueous solution but becomes soluble in an alkali aqueous solution by the action of an acid and (2) the sulfonate of the formula (I).

In the sulfonate of the formula (I), $Q^1$, $Q^2$, $Q^3$, $Q^4$ and $Q^5$ each independently represent hydrogen, optionally branched alkyl having 1 to 16 carbon atoms, optionally branched alkoxy having 1 to 16 carbon atoms, or electron attractive group. Here, at least one of $Q^1$, $Q^2$, $Q^3$, $Q^4$ and $Q^5$ represents optionally branched alkyl having 3 to 16 or otionally branched alkoxy having 3 to 16 carbon atoms.

Examples of the optionally branched alkyl having 1 to 16 carbon atoms include methyl, ethyl, propyl, isopropyl, butyl, tert-butyl, pentyl, hexyl, octyl, decyl, dodecyl, hexadecyl and the like.

Examples of the optionally branched alkoxy having 1 to 16 carbon atoms include methoxy, ethoxy, propoxy, isopropoxy, butoxy, tert-butoxy, pentyloxy, hexyloxy, isopentyloxy, decyloxy, dodecyloxy, hexadecyloxy and the like.

In the sulfonate of the formula (I), at least one of $Q^1$, $Q^2$, $Q^3$, $Q^4$ and $Q^5$ represents an electron attractive group.

Specific examples of the electron attractive group include halogen such as fluorine, chlorine, bromine and the like; a cyano, nitro, formyl, alkylcarbonyl, carboxyl, alkylsulfonyl, trifluoromethyl, perfluoroethyl, perfluorobutyl, perfluorooctyl and the like.

In the sulfonate of the formula (I), $A^+$ represents a counter ion and as the counter ion, a counter ions of the following formula (IIa), (IIb), (IIc) or (IId) are preferable:

A counter ion of the formula (IIa)

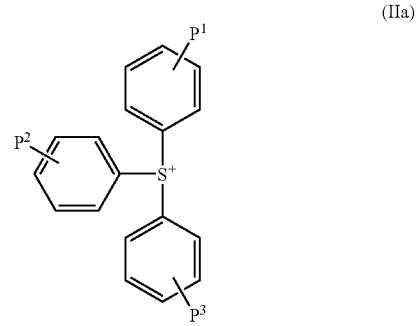

(IIa)

wherein $P^1$, $P^2$ and $P^3$ each independently represent hydrogen, hydroxyl, alkyl having 1 to 6 carbon atoms or alkoxy having 1 to 6 carbon atoms.

A counter ion of the formula (IIb)

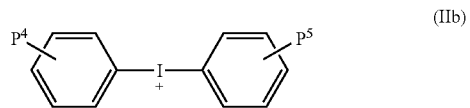

(IIb)

wherein $P^4$ and $P^5$ each independently represent hydrogen, hydroxyl, alkyl having 1 to 6 carbon atoms or alkoxy having 1 to 6 carbon atoms.

A counter ion of the formula (IIc):

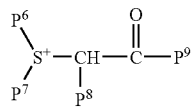
(IIc)

wherein $P^6$ and $P^7$ each independently represent alkyl having 1 to 6 carbon atoms or cycloalkyl having 3 to 10 carbon atoms, or $P^6$ and $P^7$ bond to form alicyclic hydrocarbon group having 3 to 7 carbon atoms together with the adjacent $S^+$ and at least one —$CH_2$— in the alicyclic hydrocarbon group may be substituted by —CO—, —O— or —S—, and $P^8$ represents hydrogen, $P^9$ represents alkyl having 1 to 6 carbon atoms, cycloalkyl having 3 to 10 carbon atoms or aromatic ring group optionally substituted, or $P^8$ and $P^9$ bond to form 2-oxocycloalkyl group together with the adjacent —CHCO— group.

A counter ion of the formula (IId):

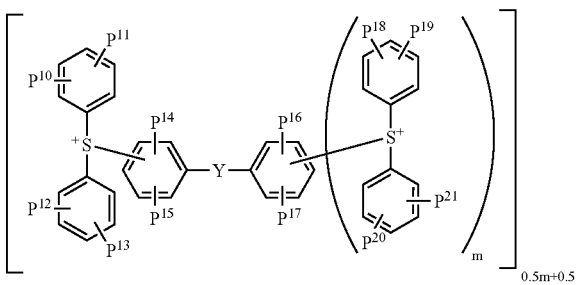
(IId)

wherein $P^{10}$, $P^{11}$, $P^{12}$, $P^{13}$, $P^{14}$, $P^{15}$, $P^{16}$, $P^{17}$, $P^{18}$, $P^{19}$, $P^{20}$ and $P^{21}$ each independently represent hydrogen, hydroxyl, alkyl having 1 to 6 carbon atoms or alkoxy having 1 to 6 carbon atoms, Y represents sulfur or oxygen, and m represents 0 or 1.

In the formula (IIa), $P^1$, $P^2$ and $P^3$ each independently represent hydrogen, hydroxyl, alkyl having 1 to 6 carbon atoms or alkoxy having 1 to 6 carbon atoms, and the alkyl and alkoxy may be linear or branched in the case of 3 or more carbon atoms.

In the formula (IIb), $P^4$ and $P^5$ each independently represent hydrogen, hydroxyl, alkyl having 1 to 6 carbon atoms or alkoxy having 1 to 6 carbon atoms, and the alkyl and alkoxy may be linear or branched in the case of 3 or more carbon atoms.

In $P^1$, $P^2$, $P^3$, $P^4$ and $P^5$, specific examples of the alkyl include methyl, ethyl, propyl, isopropyl, butyl, tert-butyl, pentyl, hexyl and the like, and examples of the alkoxy include methoxy, ethoxy, propoxy, butoxy and the like.

In the formula (IIc), $P^6$ and $P^7$ each independently represent alkyl having 1 to 6 carbon atoms or cycloalkyl having 3 to 10 carbon atoms, or $P^6$ and $P^7$ bond to form alicyclic hydrocarbon group having 3 to 7 carbon atoms together with the adjacent $S^+$. At least one —$CH_2$— in the alicyclic hydrocarbon group may be substituted by —CO—, —O— or —S—.

$P^8$ represents hydrogen and $P^9$ represents alkyl having 1 to 6 carbon atoms, cycloalkyl group having 3 to 10 carbon atoms or aromatic ring group optionally substituted, or $P^8$ and $P^9$ bond to form 2-oxocycloalkyl group together with the adjacent —CHCO—.

In $P^6$, $P^7$ and $P^9$, specific examples of the alkyl include methyl, ethyl, propyl, isopropyl, butyl, tert-butyl, pentyl, hexyl and the like, and specific examples of the cycloalkyl group include cyclopropyl, cyclobutyl, cyclopentyl, cyclohexyl, cycloheptyl and the like. Specific examples of the alicyclic hydrocarbon group formed by bonding $P^6$ and $P^7$ together with the adjacent $S^+$ include pentamethylenesulfonio group, tetramethylenesulfonio group, oxybisethylenesulfonio group, and the like. In $P^9$, specific examples of the aromatic ring group include phenyl, tolyl, xylyl, naphthyl and the like. Specific examples of the 2-oxocycloalkyl formed by bonding $P^8$ and $P^9$ together with the adjacent —CHCO— include 2-oxocyclohexyl, 2-oxocyclopentyl and the like.

In the formula (IId), $P^{10}$, $P^{11}$, $P^{12}$, $P^{13}$, $P^{14}$, $P^{15}$, $P^{16}$, $P^{17}$, $P^{18}$, $P^{19}$, $P^{20}$ and $P^{21}$ each independently represent hydrogen, hydroxyl, alkyl having 1 to 6 carbon atoms or alkoxy having 1 to 6 carbon atoms. The alkyl group and alkoxy group may be linear or branched in the case of 3 or more carbon atoms. Specific examples of the allyl include methyl, ethyl, propyl, isopropyl, butyl, tert-butyl, pentyl, hexyl and the like, and examples of the alkoxy include methoxy, ethoxy, propoxy, butoxy and the like. Y represents sulfur or oxygen. m represents 0 or 1.

Preferred examples of the sulfonate of the formula (I) include sulfonates of the following formulae (III), (IV), (V) and (VI):

The sulfonate of the formula (III)

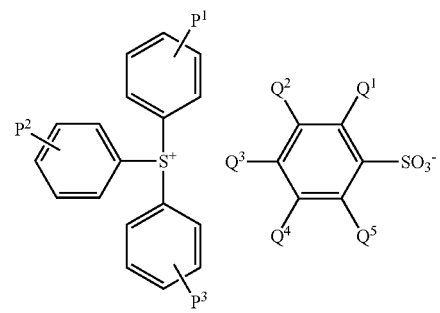
(III)

wherein $Q^1$, $Q^2$, $Q^3$, $Q^4$, $Q^5$, $P^1$, $P^2$ and $P^3$ are as defined above.

The sulfonate of the formula (IV)

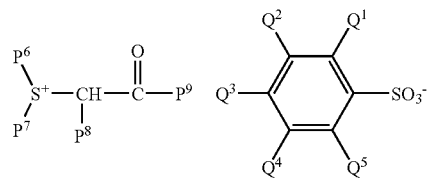
(IV)

wherein $Q^1$, $Q^2$, $Q^3$, $Q^4$, $Q^5$, $P^6$, $P^7$, $P^8$ and $P^9$ are as defined above.

The sulfonate of the formula (V)

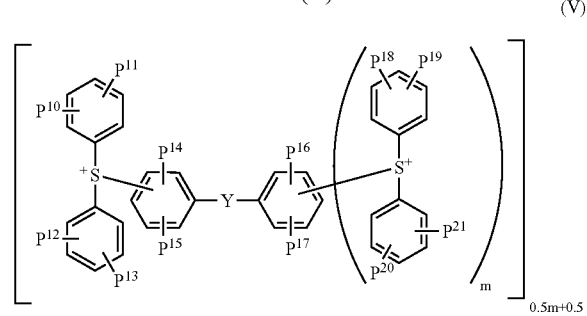
(V)

-continued

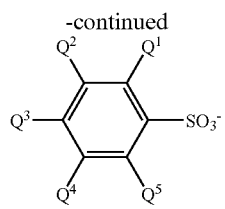

wherein $Q^1$, $Q^2$, $Q^3$, $Q^4$, $Q^5$, $P^{10}$, $P^{11}$, $P^{12}$, $P^{13}$, $P^{14}$, $P^{15}$, $P^{16}$, $P^{17}$, $P^{18}$, $P^{19}$, $P^{20}$, $P^{21}$, Y and m are as defined above.

The sulfonate of the formula (VI)

(VI)

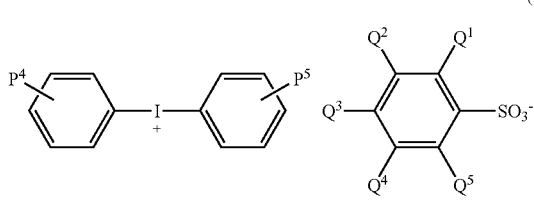

wherein $Q^1$, $Q^2$, $Q^3$, $Q^4$, $Q^5$, $P^4$ and $P^5$ are as defined above.

Examples of the sulfonate of the formula (III) include sulfonates of the formulae (III') and (IIIc'):

The sulfonate of the formula (III'):

(III')

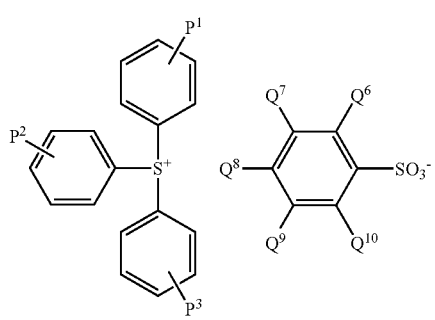

wherein $Q^6$, $Q^7$, $Q^8$, $Q^9$ and $Q^{10}$ each independently represent hydrogen, alkyl having 1 to 16 carbon atoms, alkoxy having 1 to 16 carbon atoms, or electron attractive group, with the proviso that at least one of $Q^6$, $Q^7$, $Q^8$, $Q^9$ and $Q^{10}$ represents alkyl having 3 to 16 carbon atoms or alkoxy having 3 to 16 carbon atoms, and at least one of $Q^6$, $Q^7$, $Q^8$, $Q^9$ and $Q^{10}$ is nitro group, and $P^1$, $P^2$ and $P^3$ are as defined above.

The sulfonate of the formula (IIIc'):

(IIIc')

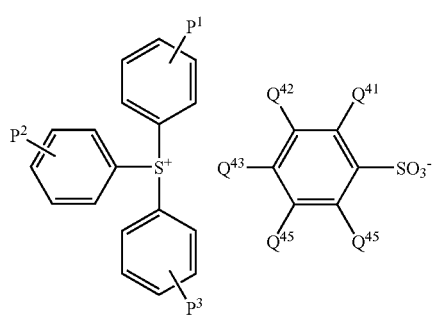

wherein $Q^{41}$, $Q^{42}$, $Q^{43}$, $Q^{44}$ and $Q^{45}$ each independently represent hydrogen, alkyl having 1 to 16 carbon atoms, alkoxy having 1 to 16 carbon atoms, or electron attractive group, with the proviso that at least one of $Q^{41}$, $Q^{42}$, $Q^{43}$, $Q^{44}$ and $Q^{45}$ represents alkyl group having 3 to 16 carbon atoms or alkoxy having 3 to 16 carbon atoms, and at least two of $Q^{41}$, $Q^{42}$, $Q^{43}$, $Q^{44}$ and $Q^{45}$ are nitro groups, and $P^1$, $P^2$ and $P^3$ are as defined above.

Example of the sulfonate of the formula (III') includes a sulfonate of the formula (IIIa):

The sulfonate of the formula (IIIa):

(IIIa)

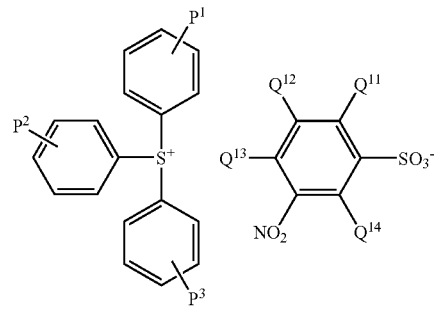

wherein $Q^{11}$, $Q^{12}$, $Q^{13}$ and $Q^{14}$ each independently represent hydrogen, alkyl having 1 to 16 carbon atoms, alkoxy having 1 to 16 carbon atoms, or electron attractive group, with the proviso that at least one of $Q^{11}$, $Q^{12}$, $Q^{13}$ and $Q^{14}$ represents alkyl having 3 to 16 carbon atoms or alkoxy having 3 to 16 carbon atoms, and $P^1$, $P^2$ and $P^3$ are as defined above.

Example of the sulfonate of the formula (IIIa) includes a sulfonate of the formula (IIIb):

The sulfonate of the formula (IIIb):

(IIIb)

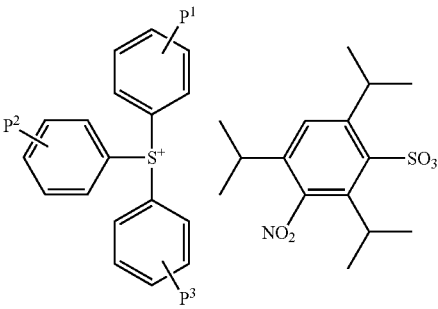

wherein $P^1$, $P^2$ and $P^3$ are as defined.

Specific example of the sulfonate of the formula (IIIb) includes a sulfonate of the formula (IIIc):

The sulfonate of the formula (IIIc):

(IIIc)

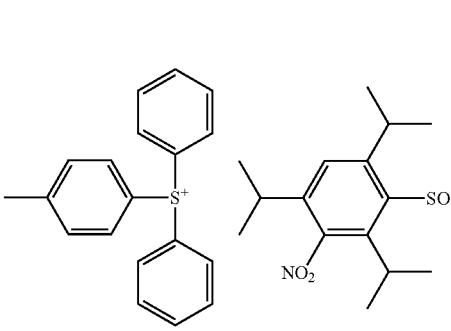

Example of the sulfonate of the formula (IIIc') includes a sulfonate of the formula (IIId):

The sulfonate of the formula (IIId):

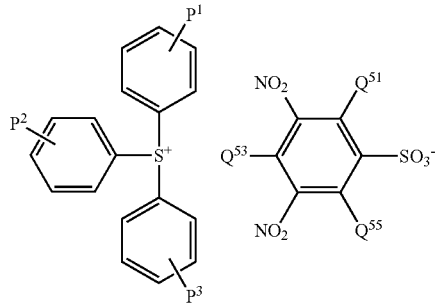

(IIId)

wherein $Q^{51}$, $Q^{53}$ and $Q^{55}$ each independently represent hydrogen, alkyl having 1 to 16 carbon atoms, alkoxy having 1 to 16 carbon atoms, or electron attractive group, with the proviso that at least one of $Q^{51}$, $Q^{53}$ and $Q^{55}$ represents alkyl having 3 to 16 carbon atoms or alkoxy having 3 to 16 carbon atoms, and $P^1$, $P^2$ and $P^3$ are as defined above.

Example of the sulfonate of the formula (IIId) includes a sulfonate of the formula (IIIe):
The sulfonate of the formula (IIIe):

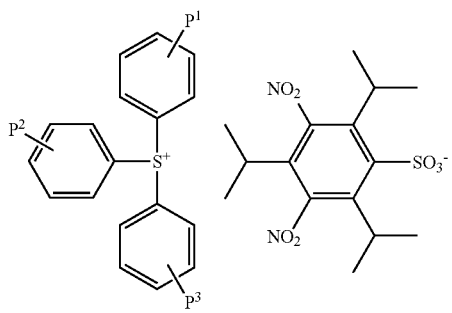

(IIIe)

wherein $P^1$, $P^2$ and $P^3$ are as defined above.

Specific example of the sulfonate of the formula (IIIe) includes a sulfonate of the formula (IIIf):
The sulfonate of the formula (IIIf).

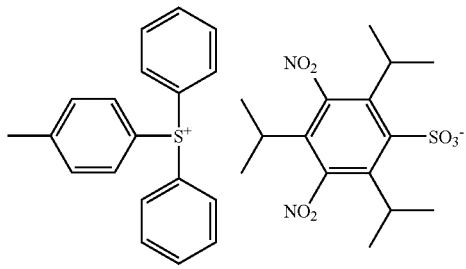

(IIIf)

Example of the sulfonate of the formula (VI) includes a sulfonate of the formula (VI'):

The sulfonate of the formula (VI'):

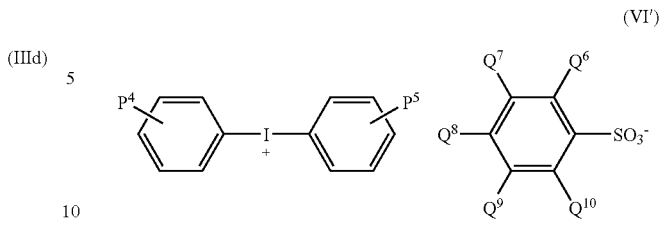

(VI')

wherein $Q^6$, $Q^7$, $Q^8$, $Q^9$, $Q^{10}$, $P^4$ and $P^5$ are as defined above.

Example of the sulfonate of the formula (VI') includes a sulfonate of the formula (VIa):
The sulfonate of the formula (VIa):

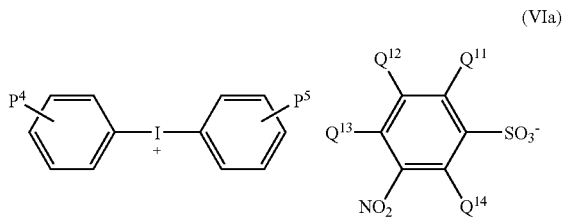

(VIa)

wherein $Q^{11}$, $Q^{12}$, $Q^{13}$, $Q^{14}$, $P^4$ and $P^5$ are as defined above.

Example of the sulfonate of the formula (VIa) includes a sulfonate of the formula (VIb):
The sulfonate of the formula (VIb):

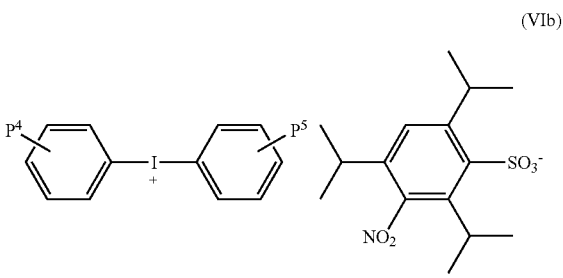

(VIb)

wherein $P^4$ and $P^5$ are as defined above.

Specific example of the sulfonate of the formula (VIb) includes a sulfonate of the formula (VIc):
The sulfonate of the formula (VIc):

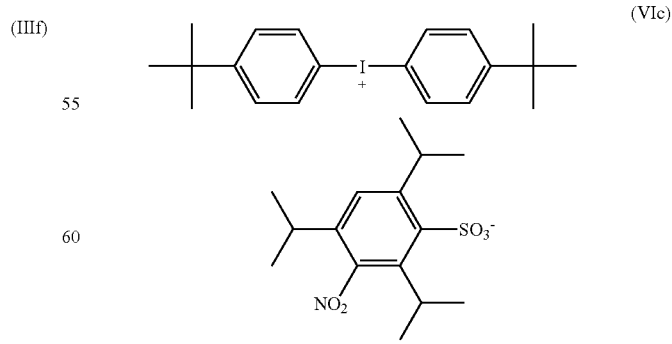

(VIc)

Specific examples of the counter ion represented by $A^+$ in the sulfonate of the formula (I) include the followings:

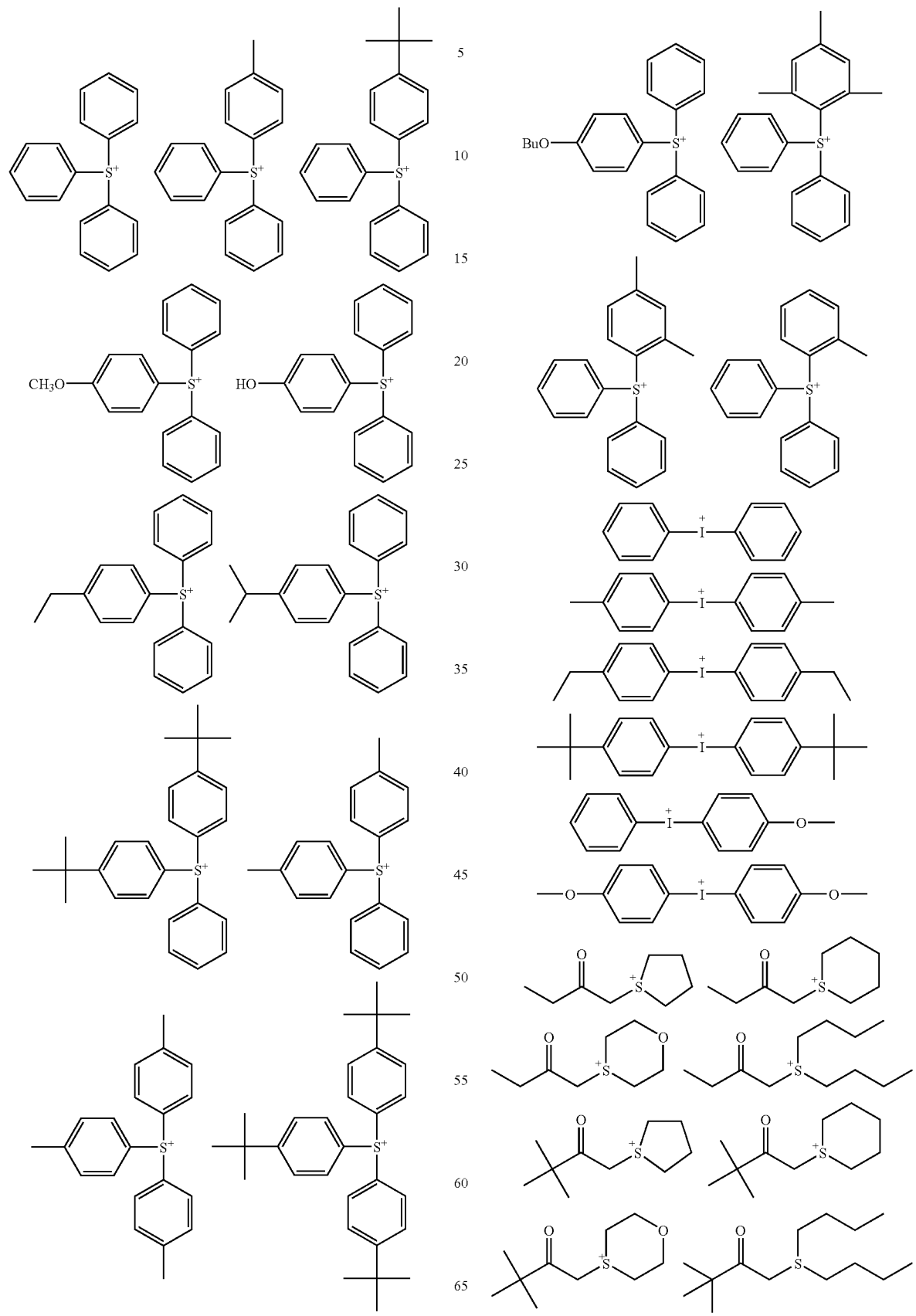

-continued
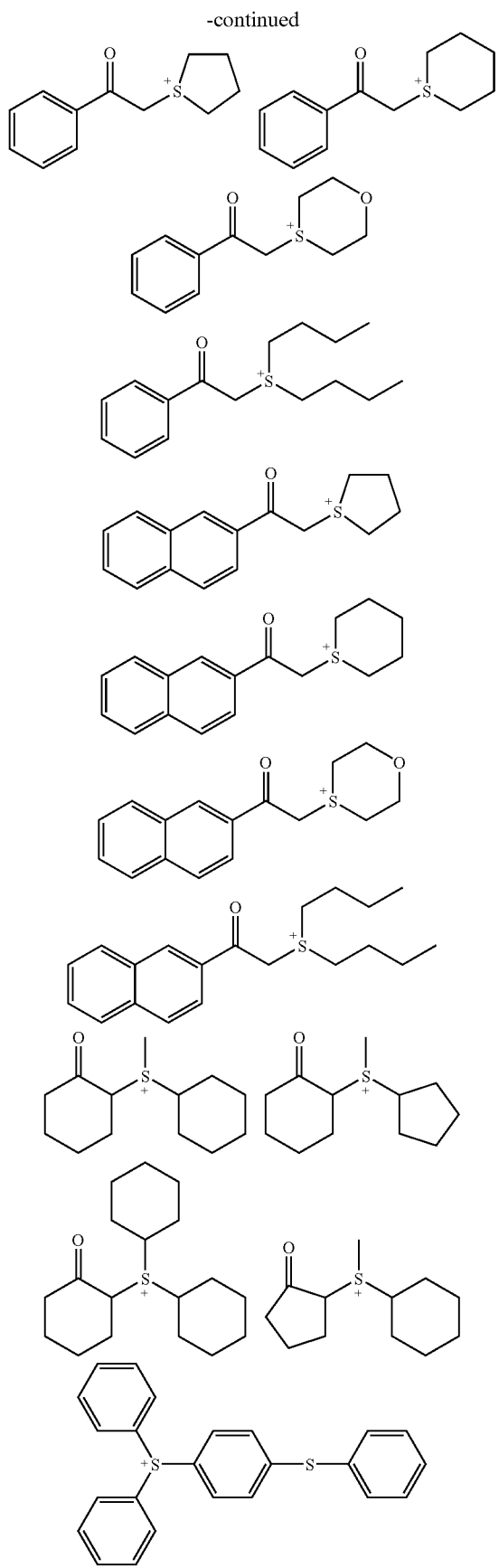
-continued
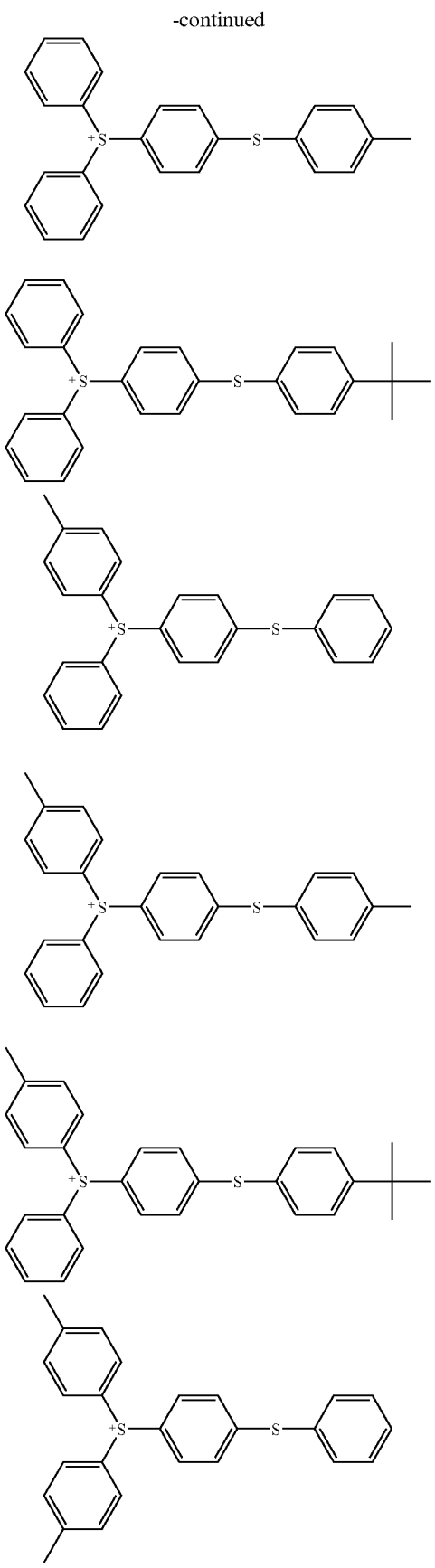

-continued
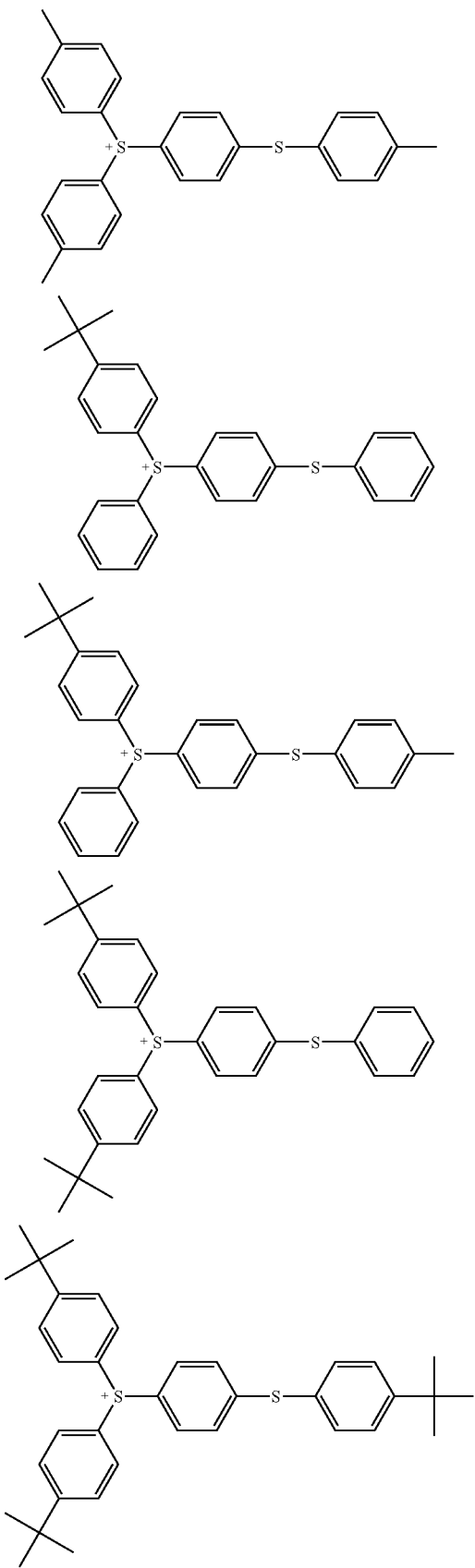
-continued
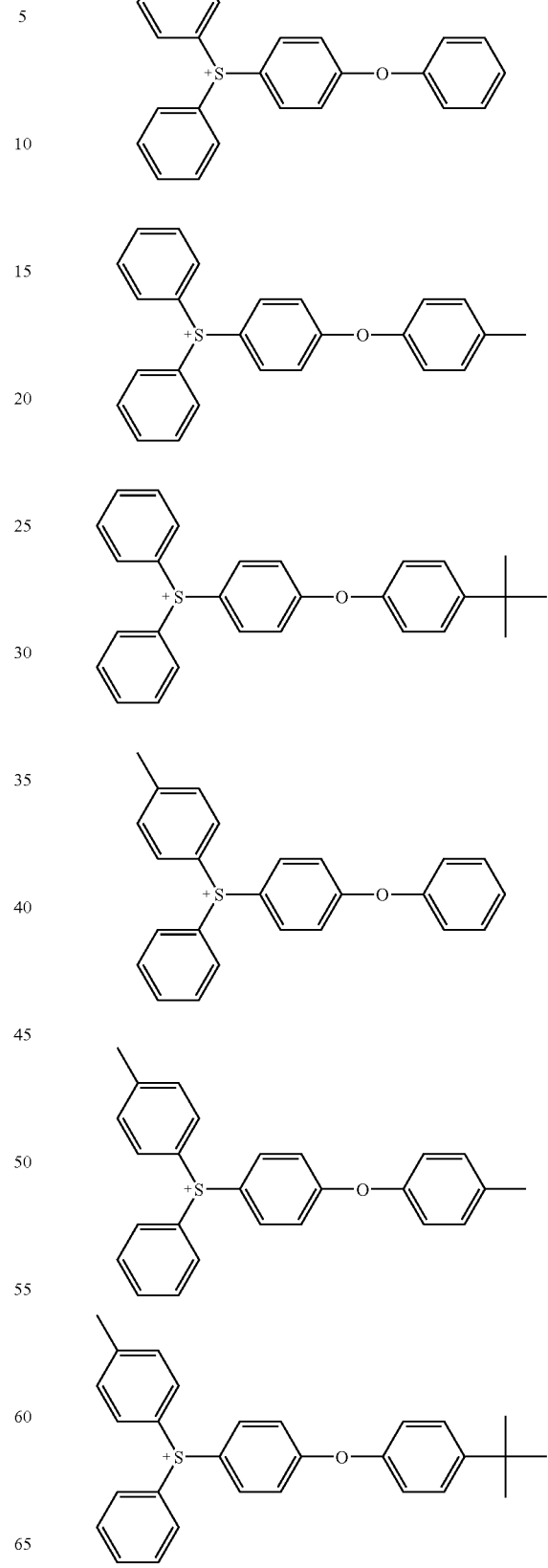

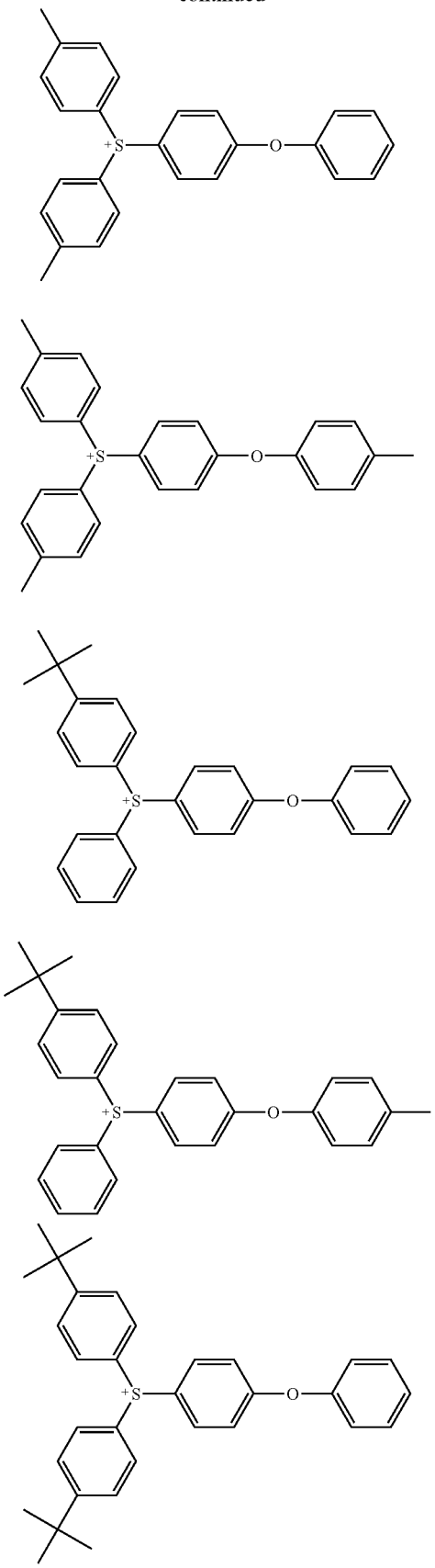
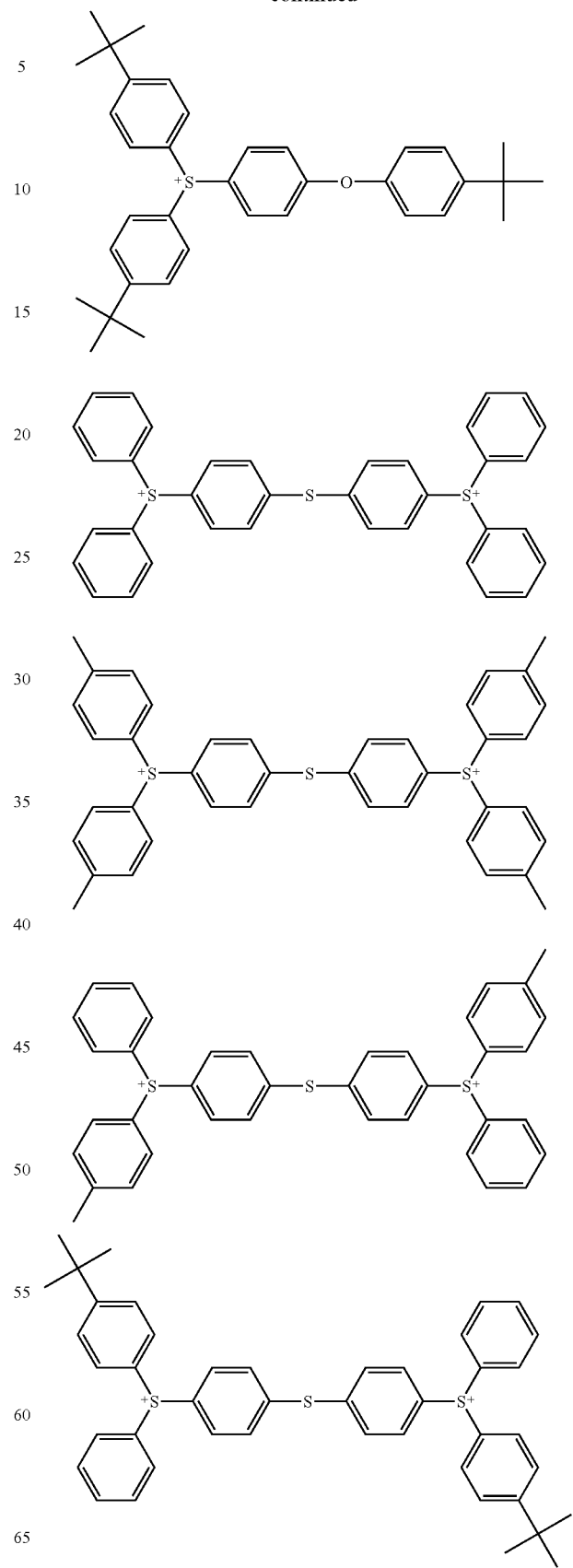

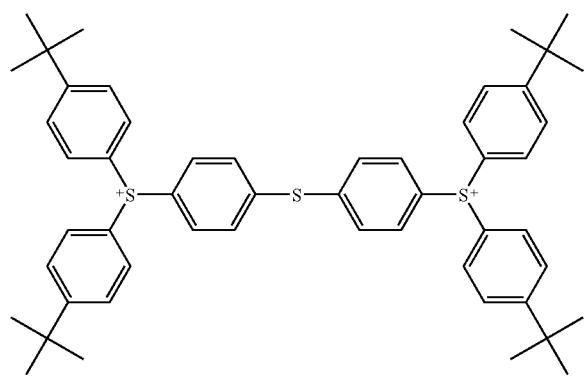
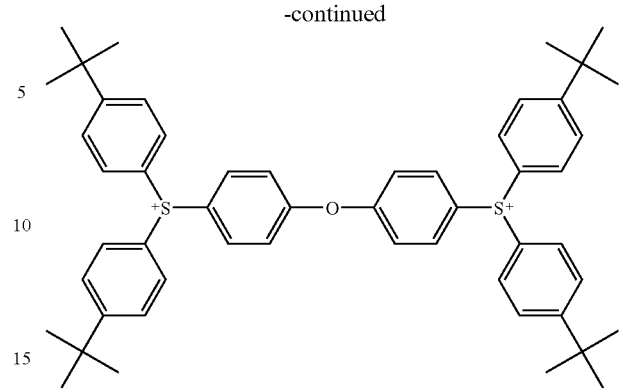
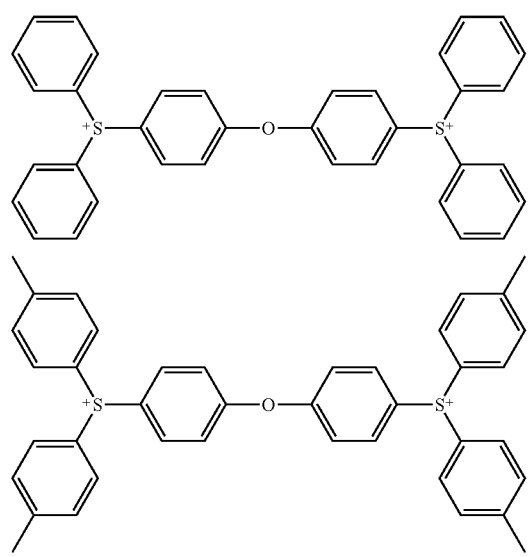
Specific examples of the sulfonate ion in the sulfonate of the formula (I) include the followings:
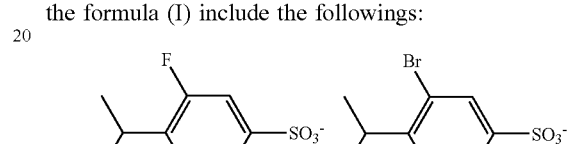
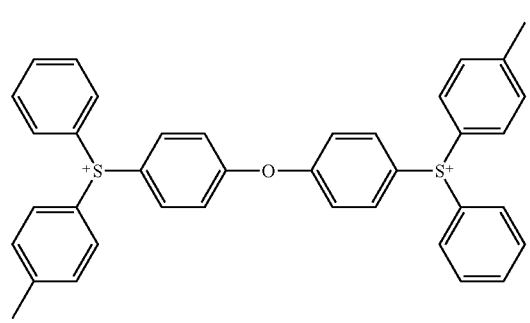
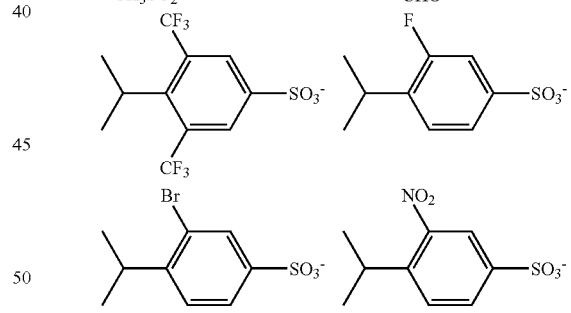
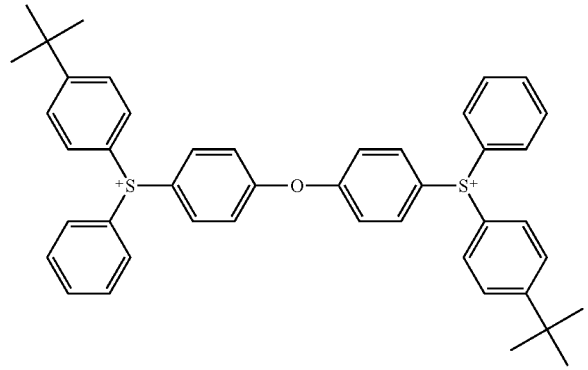
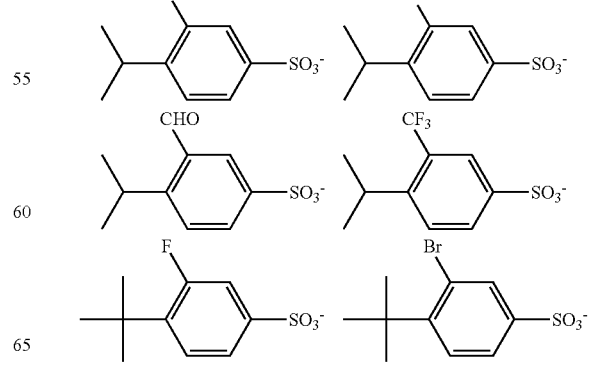

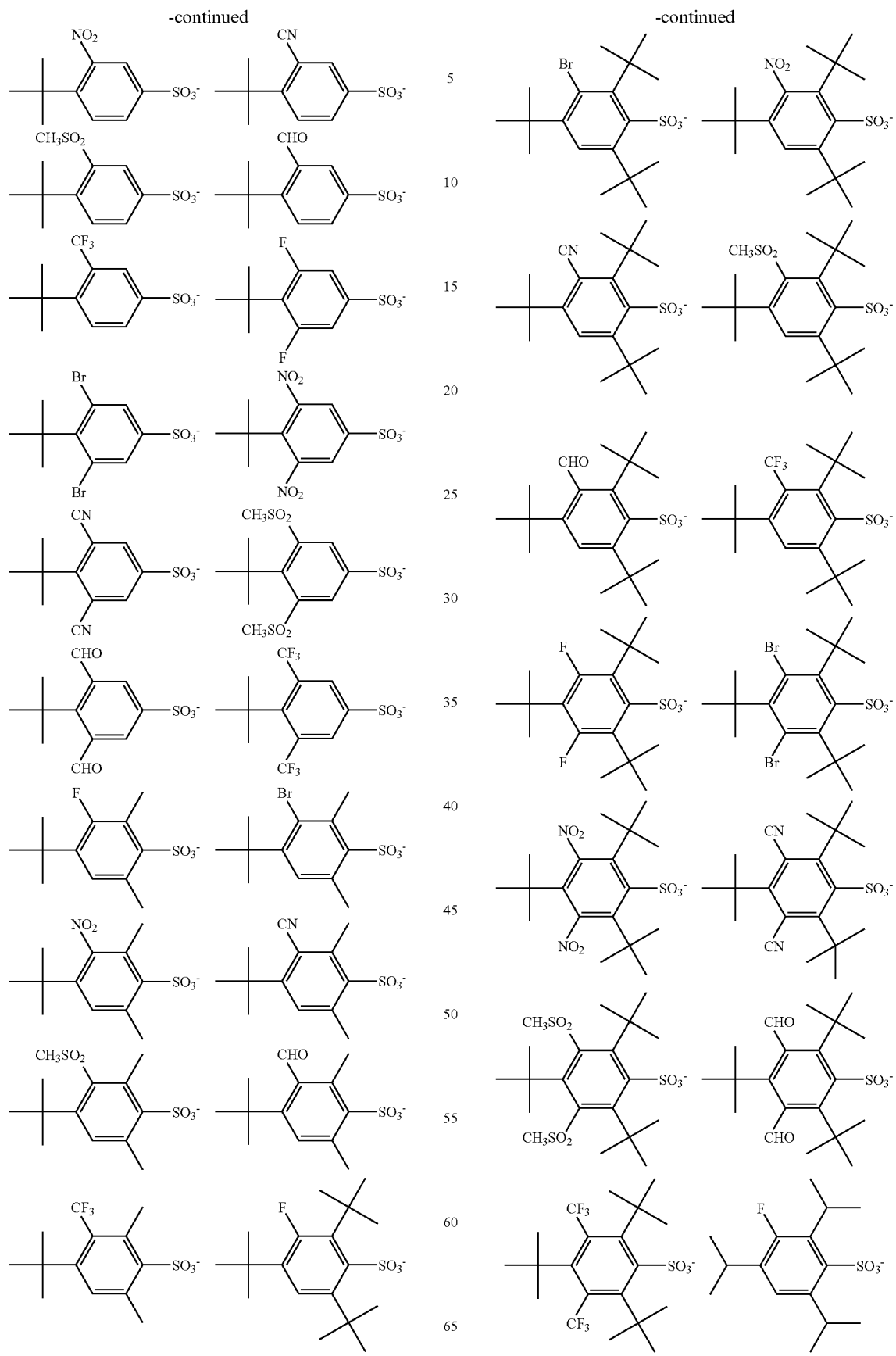

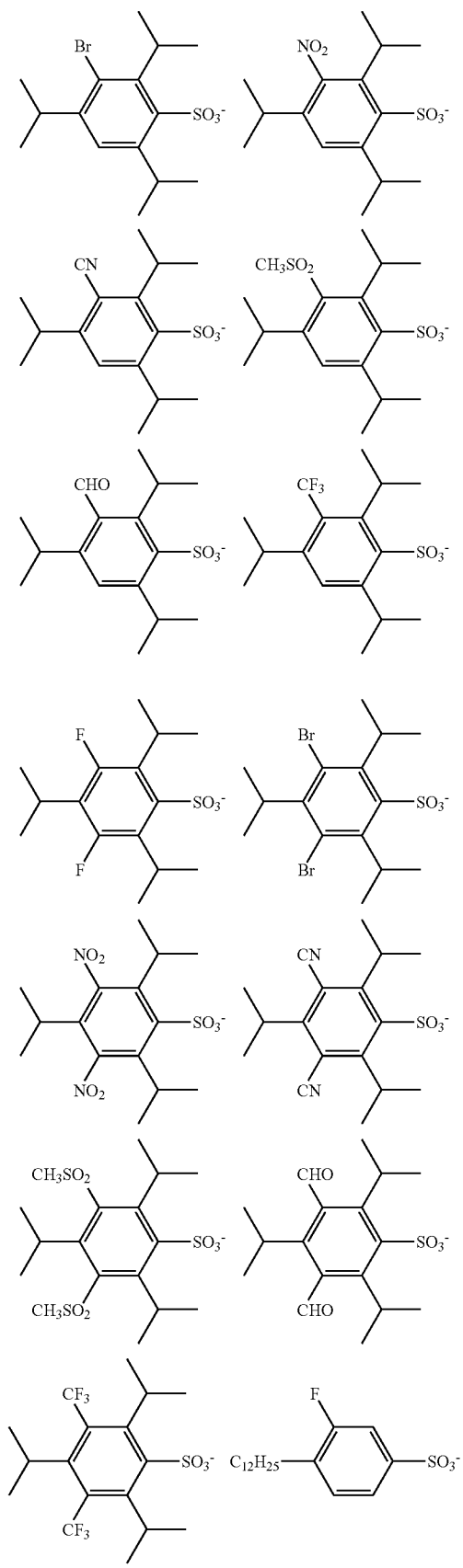
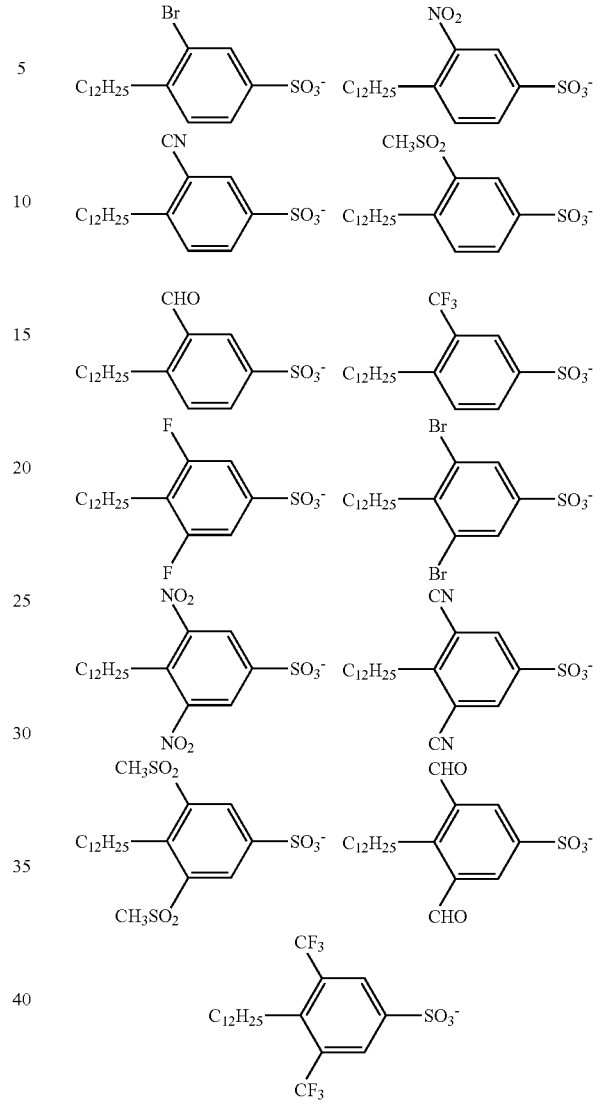

The sulfonates of the formulae (III), (IV), (V) and (VI) can be produced according to conventional methods as shown below.

The sulfonate of the formula (III) can be produced, for example, by a method reacting corresponding triphenylsulfonium bromide with silver salt of sulfonic acid having the same structure of anion part of the intended sulfonate; a method reacting corresponding aryl grignard reagent with thionyl chloride, reacting the product with triorganosilyl halide to obtain triarylsulfonium halide, and then reacting the triarylsulfonium halide with silver salt of sulfonic acid having the same structure of anion part of the intended sulfonate according to the method described in JP-H08-311018-A; and the like. The sulfonate in which $P^1$, $P^2$ or $P^3$ in the formula (III) is hydroxy, can be produced by reacting triphenylsulfonium salt having tert-butoxy on its benzene ring with sulfonic acid having the same structure of anion part of the intended sulfonate according to the method described in JP-H08-157451-A.

The sulfonate of the formula (IV) can be produced, for example, by a method reacting corresponding β-haloketone with corresponding sulfide compound to obtain corresponding sulfonium halide, and then reacting the corresuponding sulfonium halide and corresponding sulfonic acid or metal salt thereof having the same structure of anion part of the intended sulfonate applying the method described in J. Polymer Science, Polymer Chemistry Edition, Vol. 17, 2877–2892 (1979) written by S. V. Crivello et al.

The sulfonate of the formula (V) can be produced, for example, by a method reacting corresponding sulfonium halide with sulfonic acid or metal salt therof having the same structure of anion part of the intended sulfonate; a method reacting corresponding diphenylsulfoxide, aryl compound (i.e. diphenyl ether, diphenylsufoxide, and the like) and perfluoroalkanesulfonic acid in the presence of trifluoroacetic anhydride to obtain corresponding sulfonium salt, converting the corresponding sulfonium salt to salt of corresponding sulfonium cation and hydroxy anion, then salt-exchanging the product with halogenide (i.e. ammonium iodide, potassium iodide and the like) to obtain salt of corresponding sulfonium cation and halogen anion, and thereafter, reacting the salt with corresponding sulfonic acid having the same structure of anion part of the intended sulfonate according to the method described in Chem. Pharm. Bull., Vol. 29, 3753 (1981).

The sulfonate of the formula (VI) can be produced, for example, by a method reacting iodosyl sulfate with corresponding aryl compound, and then adding thereto corresponding sulfonic acid having the same structure of anion part of the intended sulfonate according to a method described in J. Am. Chem. Soc., vol. 81, 342 (1959); a method adding iodine and trifluoro acetic acid to a mixture of acetic anhydride and fuming nitric acid, then reacting the reaction mixture and corresponding aryl compound, and then adding thereto corresponding sulfonic acid having the same structure of anion part of the intended sulfonate; a method reacting a mixture of corresponding aryl compound, acetic anhydride and potassium iodate by adding drop-wise concentrated sulfuric acid thereto, and then adding thereto corresponding sulfonic acid having the same structure of anion part of the intended sulfonate according to a method described in JP-H09-179302-A; and the like.

Next, resin components constituting the present composition will be explained. The resin used in the present composition contains a structural unit having an acid-labile group and the resin is insoluble or poorly soluble itself in alkali aqueous solution and shows partial dissociation of groups by the action of an acid to become soluble in alkali aqueous solution after the dissociation. The acid-labile group can be selected from conventionally known various groups.

Specifically, various carboxylate groups (—COOR) are mentioned as the acid-labile group, and examples thereof include alky carboxylate groups such as methyl carboxylate group and tert-butyl carboxylate group; acetal type carboxylate groups such as methoxymethyl carboxylate group, ethoxymethyl carboxylate group, 1-ethoxyethyl carboxylate group, 1-isobutoxyethyl carboxylate group, 1-isopropoxyethyl carboxylate group, 1-ethoxypropyl carboxylate group, 1-(2-methoxyethoxy)ethyl carboxylate group, 1-(2-acetoxyethoxy)ethyl carboxylate group, 1-[2-(1-adamantyloxy)ethoxy]ethyl carboxylate group, 1-[2-(1-adamantanecarbonyloxy)ethoxy]ethyl carboxylate group, tetrahydro-2-furyl carboxylate group and tetrahydro-2-pyranyl carboxylate group; alicyclic esters such as isobornyl carboxylate group, 2-alkyl-2-adamantyl carboxylate group, 1-(1-adamantyl)-1-alkylalkyl carboxylate group, and the like.

Monomers to be derived into structural units having such carboxylate group (—COOR) may be (meth)acryl-based monomers such as methacrylates and acrylates, or those obtained by bonding of a carboxylate group to alicyclic monomer such as norbornenecarboxylate, tricyclodecenecarboxylate and tetracyclodecenecarboxylate.

Among the above-mentioned monomers, it is preferable to use those having a bulky group containing alicyclic goup such as, for example, 2-alkyl-2-adamantyl and 1-(1-adamantyl)-1-alkylalkyl, as the group dissociated by the action of an acid, since excellent resolution is obtained when used in the present composition.

Examples of such monomer containing a bulky group include 2-alkyl-2-adamantyl(meth)acrylate, 1-(1-adamantyl)-1-alkylalkyl(meth)acrylate, 2-alkyl-2-adamantyl 5-norbornene-2-carboxylate, 1-(1-adamantyl)-1-alkylalkyl 5-norbornene-2-carboxylate, and the like.

Particularly when 2-alkyl-2-adamantyl(meth)acrylate is used as the monomer for the resin component in the present composition, excellent resolution is obtained. Typical examples of such 2-alkyl-2-adamantyl(meth)acrylate include 2-methyl-2-adamantyl acrylate, 2-methyl-2-adamantyl methacrylate, 2-ethyl-2-adamantyl acrylate, 2-ethyl-2-adamantyl methacrylate, 2-n-butyl-2-adamantyl acrylate and the like. When particularly 2-ethyl-2-adamantyl(meth)acrylate is used for the present composition, balance between sensitivity and heat resistance is excellent. In the present invention, two or more kind of monomers having group dissociated by the action of an acid may be used together, if necessary.

2-alkyl-2-adamantyl(meth)acrylate can usually be produced by reacting 2-alkyl-2-adamantanol or metal salt thereof with an acrylic halide or methacrylic halide.

The resin used for the present composition can also contain, in addition to the above-mentioned structural units having an acid-labile group, other structural units not dissociated or not easily dissociated by the action of an acid. Examples of such other structural units which can be contained include structural units derived from monomers having a free carboxyl group such as acrylic acid and methacrylic acid, structural units derived from aliphatic unsaturated dicarboxylic anhydrides such as maleic anhydride and itaconic anhydride, structural unit derived from 2-norbornene, structural unit derived from (meth)acrylonitrile, and the like.

In the case of KrF exposure, there is no problem on light absorption, and a structural unit derived from hydroxystyrene can be further contained.

Particularly, to contain, in addition to the structural unit having an acid-labile group, further at least one structural unit selected from the group consisting of a structural unit derived from p-hydroxystyrene, a structural unit derived from m-hydroxystyrene, a structural unit derived from 3-hydroxy-1-adamantyl(meth)acrylate, a structural unit derived from 3,5-dihydroxy-1-adamantyl(meth)acrylate, a structural unit derived from (meth)acryloyloxy-γ-butyrolactone having a lactone ring optionally substituted by alkyl, a structural unit of the following formula (VIIa) and a structural unit of the following formula (VIIb), in the resin in the present composition, is preferable from the standpoint of the adhesiveness of resist to a substrate.

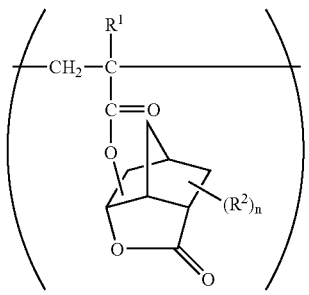
(VIIa)

-continued

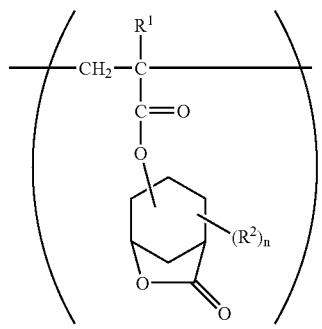

(VIIb)

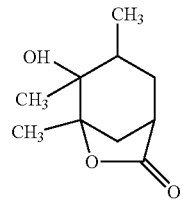

In the formulae (VIIa) and (VIIb), $R^1$ and $R^2$ each independently represent hydrogen, methyl or trifluoromethyl, and n represents an integer of 1 to 3.

3-Hydroxy-1-adamantyl(meth)acrylate and 3,5-dihydroxy-1-adamantyl(meth)acrylate can be produced by, for example, reacting corresponding hydroxyadamantane with (meth)acrylic acid or its acid halide, and they are also commercially available.

Further, (meth)acryloyloxy-γ-butyrolactone can be produced by reacting α- or β-bromo-γ-butyrolactone having a lactone ring optionally substituted by alkyl with acrylic acid or methacrylic acid, or reacting α- or β-bromo-γ-butyrolactone having a lactone ring optionally substituted by alkyl with acrylic halide or methacrylic halide.

As monomers to be derived into structural units of the formulae (VIIa) and (VIIb), specifically listed are, for example, (meth)acrylates of alicyclic lactones having hydroxyl described below, and mixtures thereof, and the like. These esters can be produced, for example, by reacting corresponding alicyclic lactone having hydroxyl with (meth) acrylic acids, and the production method thereof is described in, for example, JP2000-26446-A.

When any of the structural unit derived from 3-hydroxy-1-adamantyl(meth)acrylate, the structural unit derived from 3,5-dihydroxy-1-adamantyl(meth)acrylate, the structural unit derived from α-(meth)acryloyloxy-γ-butyrolactone, the structural unit derived from β-(meth)acryloyloxy-γ-butyrolactone and the structural unit of the formulae (VIIa) and (VIIb) is contained in the resin, not only the adhesiveness of the resist to a substrate is improved, but also the resolution of the resist is improved.

Here, examples of the (meth)acryloyloxy-γ-butyrolactone include α-acryloyloxy-γ-butyrolactone, α-methacryloyloxy-γ-butyrolactone, α-acryloyloxy-β, β- dimethyl-γ-butyrolactone, α-methacryloyloxy-β,β-dimethyl-γ-butyrolactone, α-acryloyloxy-α-methyl-γ-butyrolactone, α-methacryloyloxy-α-methyl-γ-butyrolactone, β-acryloyloxy-γ-butyrolactone, β-methacryloyloxy-γ-butyrolactone, β-methacryloyloxy-α-methyl-γ-butyrolactone and the like.

In the case of KrF excimer laser exposure, sufficient transmittance can be obtained even the structural unit derived from hydroxystyrene is contained in the resin. Specifically, copolymerization resins containing a structural unit derived from p- or m-hydroxystyrene as described below are listed. For obtaining such copolymerization resins, the corresponding (meth)acrylic ester monomer can be radical-polymerized with acetoxystyrene and styrene, and then the reaction mixture can be de-acetylated with an acid.

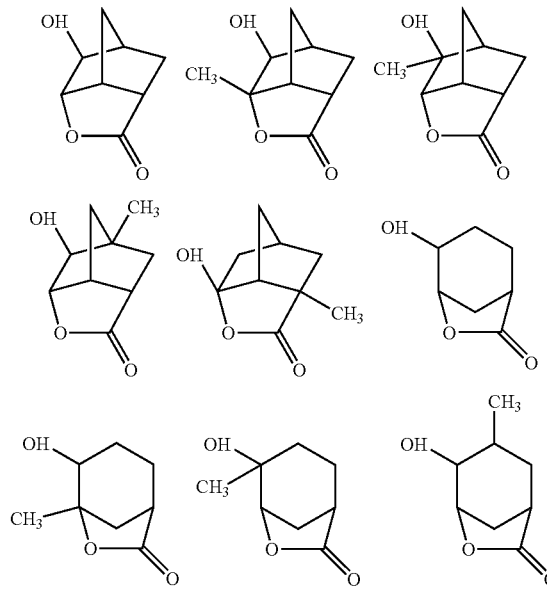

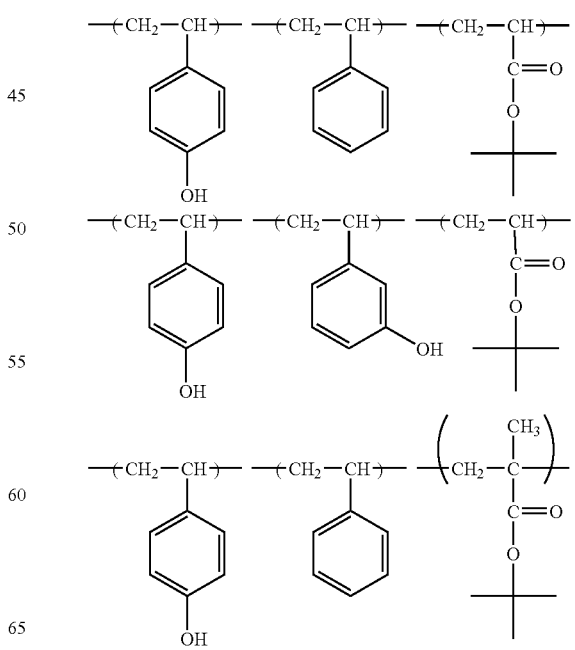

-continued
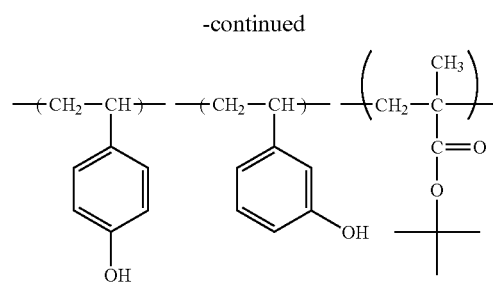
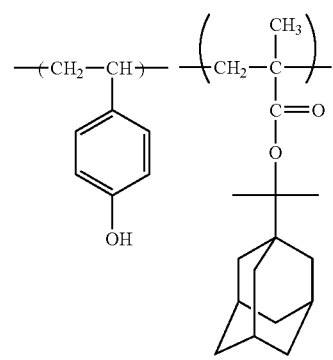
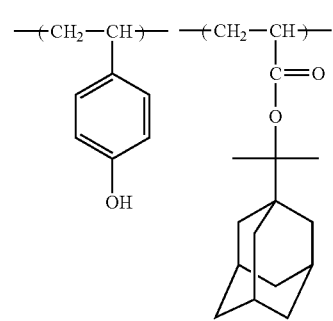
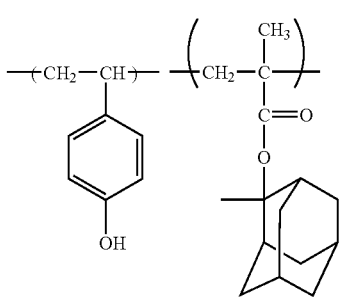
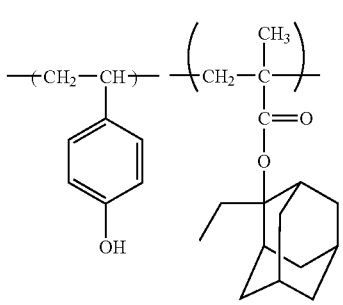
-continued
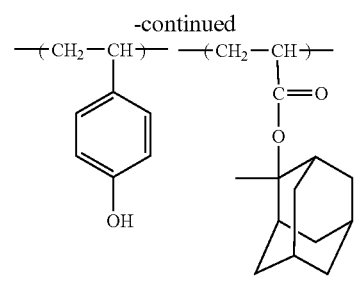
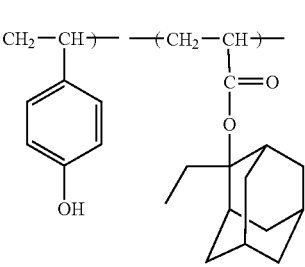
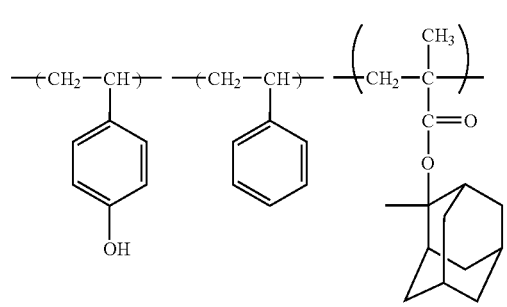
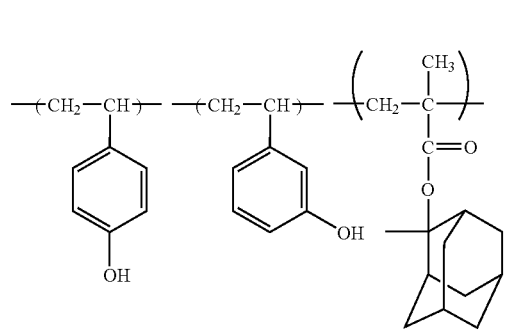
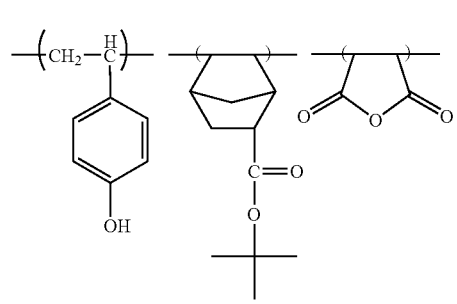

-continued

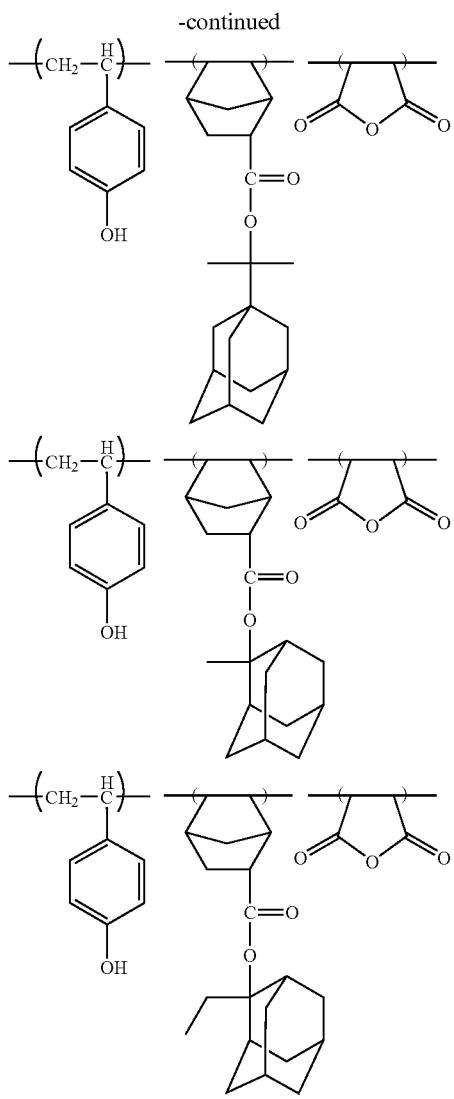

In these cases, it is advantageous from the standpoint of dry etching resistance to contain 2-alkyl-2-adamantyl or 1-(1-adamantyl)-1-alkylalkyl as the acid labile group in the resin.

The resin containing a structural unit derived from 2-norbornene shows strong structure because of alicyclic group directly present on its main chain and shows a property that dry etching resistance is excellent. The structural unit derived from 2-norbornene can be introduced into the main chain by radical polymerization using, for example, in addition to corresponding 2-norbornene, aliphatic unsaturated dicarboxylic anhydrides such as maleic anhydride and itaconic anhydride together. The structural unit derived from 2-norbornene is formed by opening of its double bond, and can be represented by the formula (VIII). The structural unit derived from maleic anhydride and the structural unit derived from itaconic anhydride which are the structural unit derived from aliphatic unsaturated dicarboxylic anhydrides are formed by opening of their double bonds, and can be represented by the formula (IX) and the formula (X), respectively.

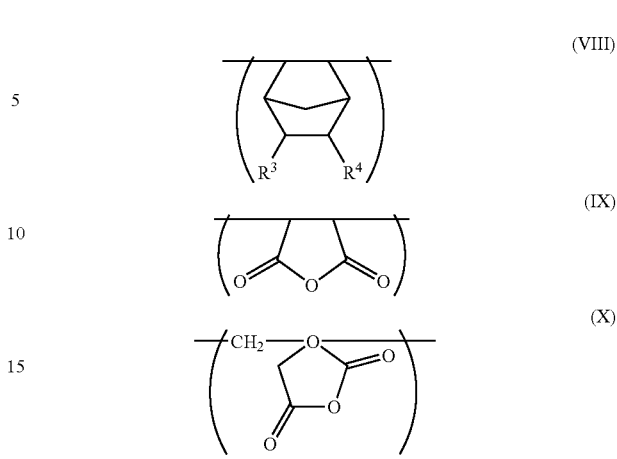

Here, $R^3$ and $R^4$ in the formula (VIII) each independently represent hydrogen, alkyl having 1 to 3 carbon atoms, hydroxyalkyl having 1 to 3 carbon atoms, carboxyl, cyano or —COOZ group in which Z represents alcohol residue, or $R^3$ and $R^4$ can bond together to form a carboxylic anhydride residue represented by —C(=O)OC(=O)—.

In $R^3$ and $R^4$, examples of the alkyl include methyl, ethyl, propyl and isopropyl, specific examples of hydroxyalkyl include hydroxymethyl, 2-hydroxyethyl and the like.

In $R^3$ and $R^4$, —COOZ group is an ester formed from carboxyl, and as the alcohol residue corresponding to Z, for example, optionally substituted alkyls having about 1 to 8 carbon atoms, 2-oxooxolan-3- or -4-yl and the like are listed, and as the substituent on the alkyl, hydroxyl, alicyclic hydrocarbon residues and the like are listed.

Specific examples of —COOZ include methoxycarbonyl, ethoxycarbonyl, 2-hydroxyethoxycarbonyl, tert-butoxycarbony, 2-oxooxalan-3-yloxycarbonyl, 2-oxooxalan-4-yloxycarbonyl, 1,1,2-trimethylpropoxycarbonyl, 1-cyclohexyl-1-methylethoxycarbonyl, 1-(4-methylcyclohexyl)-1-methylethoxycarbonyl, 1-(1-adamantyl)-1-methylethoxycarbonyl and the like.

Specific examples of the monomer used to derive the structural unit represented by the formula (VIII) may include the followings;
2-norbornene,
2-hydroxy-5-norbornene,
5-norbornen-2-carboxylic acid,
methyl 5-norbornen-2-carboxylate,
t-butyl 5-norbornen-2-carboxylate,
1-cyclohexyl-1-methylethyl 5-norbornen-2-carboxylate,
1-(4-methylcyclohexyl)-1-methylethyl 5-norbornen-2-carboxylate,
1-(4-hydroxycyclohexyl)-1-methylethyl 5-norbornen-2-carboxylate,
1-methyl-1-(4-oxocyclohexyl)ethyl 5-norbornen-2-carboxylate,
1-(1-adamantyl)-1-methylethyl 5-norbornen-2-carboxylate,
1-methylcyclohexyl 5-norbornen-2-carboxylate,
2-methyl-2-adamantyl 5-norbornen-2-carboxylate,
2-ethyl-2-adamantyl 5-norbornen-2-carboxylate,
2-hydroxyethyl 5-norbornen-2-carboxylate,
5-norbornen-2-methanol,
5-norbornen-2,3-dicarboxylic acid anhydride, and the like.

The resin used in the present composition preferably contains structural unit(s) having an acid-labile group generally in a ratio of 10 to 80% by mol in all structural units of the resin though the ratio varies depending on the kind of radiation for patterning exposure, the kind of an acid-labile group, and the like.

When the structural units particularly derived from 2-alkyl-2-adamantyl(meth)acrylate or 1-(1-adamantyl)-1-alkylalkyl(meth)acrylate are used as the acid-labile group, it is advantageous that the ratio of the structural units is 15% by mol or more in all structural units of the resin.

When, in addition to structural units having an acid-labile group, other structural units not easily dissociated by the action of an acid, for example, a structural unit derived from 3-hydroxy-1-adamantyl(meth)acrylate, a structural units derived from 3,5-dihydroxy-1-adamantyl(meth)acrylate or α-(meth)acryloyloxy-γ-butyrolactone, a structural units derived from β-(meth)acryloyloxy-γ-butyrolactone, a structural unit of the formula (VIIa) or (VIIb), a structural unit derived from hydroxystyrene, a structural unit of the formula (VIII), a structural unit derived from maleic anhydride of the formula (IX) which is a structural unit derived from an aliphatic unsaturated dicarboxylic anhydride, a structural unit derived from itaconic anhydride of the formula (X) and the like are contained, it is preferable that the sum of these structural units is in the range of 20 to 90% by mol based on all structural units of the resin.

When 2-norbornenes and aliphatic unsaturated dicarboxylic anhydride are used as copolymerization monomer, it is preferable to use them in excess amount in view of a tendency that these are not easily polymerized.

In the present composition, performance deterioration caused by inactivation of acid which occurs due to post exposure delay can be diminished by adding basic compounds, particularly, basic nitrogen-containing organic compounds, for example, amines as a quencher.

Specific examples of such basic nitrogen-containing organic compounds include the ones represented by the following formulae:

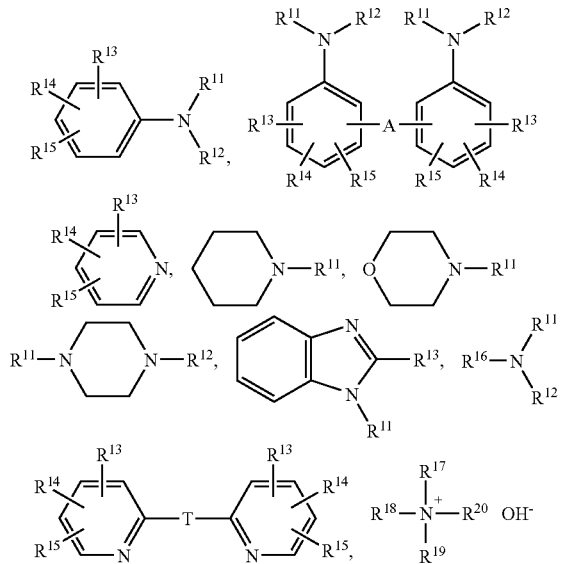

Wherein $R^{11}$ and $R^{12}$ represent each independently hydrogen, alkyl, cycloalkyl or aryl. The alkyl preferably has about 1 to 6 carbon atoms, the cycloalkyl preferably has about 5 to 10 carbon atoms, and the aryl preferably has about 6 to 10 carbon atoms. Furthermore, at least one hydrogen on the alkyl, cycloalkyl or aryl may each independently be substituted by a hydroxyl group, an amino group, or an alkoxy group having 1 to 6 carbon atoms. At least one hydrogen on the amino group may each independently be substituted by an alkyl group having 1 to 4 carbon atoms.

$R^{13}$, $R^{14}$ and $R^{15}$ each independently represent hydrogen, alkyl, cycloalkyl, aryl or alkoxy. The alkyl preferably has about 1 to 6 carbon atoms, the cycloalkyl preferably has about 5 to 10 carbon atoms, the aryl preferably has about 6 to 10 carbon atoms, and the alkoxy preferably has about 1 to 6 carbon atoms. Furthermore, at least one hydrogen on the alkyl, cycloalkyl, aryl or alkoxy may each independently be substituted by a hydroxyl group, an amino group, or an alkoxy group having 1 to 6 carbon atoms. At least one hydrogen on the amino group may be substituted by an alkyl group having 1 to 4 carbon atoms.

$R^{16}$ represents alkyl or cycloalkyl. The alkyl preferably has about 1 to 6 carbon atoms, and the cycloalkyl preferably has about 5 to 10 carbon atoms. Furthermore, at least one hydrogen on the alkyl or cycloalkyl may each independently be substituted by a hydroxyl group, an amino group, or an alkoxy group having 1 to 6 carbon atoms. At least one hydrogen on the amino group may be substituted by an alkyl group having 1 to 4 carbon atoms.

$R^{17}$, $R^{18}$, $R^{19}$ and $R^{20}$ each independently represent alkyl, cycloalkyl or aryl. The alkyl preferably has about 1 to 6 carbon atoms, the cycloalkyl preferably has about 5 to 10 carbon atoms, and the aryl preferably has about 6 to 10 carbon atoms. Furthermore, at least one hydrogen on the alkyl, cycloalkyl or aryl may each independently be substituted by a hydroxyl group, an amino group, or an alkoxy group having 1 to 6 carbon atoms. At least one hydrogen on the amino group may each independently be substituted by an alkyl group having 1 to 4 carbon atoms.

T represents alkylene, carbonyl, imino, sulfide or disulfide. The alkylene preferably has about 2 to 6 carbon atoms.

Moreover, among $R^{11}$–$R^{20}$, in regard to those which can be straight-chained or branched, either of these may be permitted.

Examples of such compounds include hexylamine, heptylamine, octylamine, nonylamine, decylamine, aniline, 2-, 3- or 4-methylaniline, 4-nitroaniline, 1- or 2-naphtylamine, ethylenediamine, tetramethylenediamine, hexamethylenediamine, 4,4'-diamino-1,2-diphenylethane, 4,4'-diamino-3,3'-dimethyldiphenylmethane, 4,4'-diamino-3,3'-diethyldiphenylmethane, dibutylamine, dipentylamine, dihexylamine, diheptylamine, dioctylamine, dinonylamine, didecylamine, N-methylaniline, piperidine, diphenylamine, triethylamine, trimethylamine, tripropylamine, tributylamine, tripentylamine, trihexylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethydiheptylamine, ethyldioctylamine, ethyldinonylamine, ethyldidecylamine, dicyclohexylmethylamine, tris[2-(2-methoxyethoxy)ethyl]amine, triisopropanolamine, N,N-dimethylaniline, 2,6-isopropylaniline, imidazole, pyridine, 4-methylpyridine, 4-methyimidazole, bipyridine, 2,2'-dipyridylamine, di-2-pyridyl ketone, 1,2-di(2-pyridyl)ethane, 1,2-di(4-pyridyl)ethane, 1,3-di(4-pyridyl)propane, 1,2-bis(2-pyridyl)ethylene, 1,2-bis(4-pyridyl)ethylene, 1,2-bis(4-pyridyloxy)ethane, 4,4'-dipyridyl sulfide, 4,4'-dipyridyl disulfide, 1,2-bis(4-pyridyl)ethylene, 2,2'-dipicolylamine, 3,3'-dipicolylamine, tetramethylammonium hydroxide, tetraisopropylammonium hydroxide, tetrabutylammonium hydroxide, tetra-n-hexylammonium hydroxide, tetra-n-octylammonium hydroxide, phenyltrimethylammonium hydroxide, 3-trifluoromethylphenyltrimethylammonium hydroxide, (2-hydroxyethyl)trimethylammonium hydroxide (so-called "choline"), and the like.

Furthermore, hindered amine compounds having piperidine skeleton as disclosed in JP-A-H11-52575 can be used as quencher.

It is preferable that the present composition contains resin in an amount of about 80 to 99.9% by weight and the sufonate of the formula (I) in an amount of 0.1 to 20% by weight based on the total solid content of the present composition.

When basic compound is used as a quencher, it is preferable that the basic compound is contained in an amount of about 0.01 to 1% by weight based on the total solid content of the present composition.

The present composition can contain, if necessary, various additives in small amount such as a sensitizer, solution suppressing agent, other resins, surfactant, stabilizer, dye and the like, as long as the effect of the present invention is not prevented.

The present composition is usually in the form of a resist liquid composition in which the aforementioned ingredients are dissolved in a solvent, and the resist liquid composition is to be applied onto a substrate such as a silicon wafer by a conventional process such as spin coating. The solvent used here is sufficient to dissolve the aforementioned ingredients, have an adequate drying rate, and give a uniform and smooth coat after evaporation of the solvent and, hence, solvents generally used in the art can be used. In the present invention, the total solid content means total content exclusive of solvents.

Examples thereof include glycol ether esters such as ethylcellosolve acetate, methylcellosolve acetate and propylene glycol monomethyl ether acetate; esters such as ethyl lactate, butyl lactate, amyl lactate and ethyl pyruvate and the like; ketones such as acetone, methyl isobutyl ketone, 2-heptanone and cyclohexanone; cyclic esters such as γ-butyrolactone, and the like. These solvents can be used each alone or in combination of two or more.

A resist film applied onto the substrate and then dried is subjected to exposure for patterning, then heat-treated for facilitating a deblocking reaction, and thereafter developed with an alkali developer. The alkali developer used here may be any one of various alkaline aqueous solutions used in the art, and generally, an aqueous solution of tetramethylammonium hydroxide or (2-hydroxyethyl)trimethylammonium hydroxide (commonly known as "choline") is often used.

The present invention will be described more specifically by way of examples, which are not construed to limit the scope of the present invention. The "%" and "part(s)" used to represent the content of any component and the amount of any material used in the following examples are on a weight basis unless otherwise specifically noted. The weight-average molecular weight of any material used in the following examples is a value found by gel permeation chromatography using styrene as a standard reference material.

ACID GENERATOR SYNTHESIS EXAMPLE 1

Synthesis of Acid Generator B1

Into a flask was charged 20 parts by 2,4,6-triisopropyl-3-nitrobenzenesulfonic acid, 80 parts of acetonitrile and 40 parts of acetone, and the mixture was stirred at room temperature for 16 hours. To this was added 7.46 parts of silver oxide and the mixture was stirred for 16 hours at room temperature. The resulting mixture was filtrated and concentrated to obtain 23.68 parts of silver 2,4,6-triisopropyl-3-nitrobenzenesulfonate.

Into a flask was charged 20 parts of silver 2,4,6-triisopropyl-3-nitrobenzenesulfonate and 185.35 parts of methanol, and to this was added dropwise mixed solution of 18.53 parts of p-tolyldiphenylsulfonium iodide and 185.35 parts of methanol. After dropping, the mixture was stirred for 16 hours at room temperature, and filtrated, then, the filtrate was concentrated. To the concentrate was added 300 parts of chloroform, and the mixture was washed with 75 parts of ion exchanged water three times. Then, the mixture was concentrated and stirred, then, crystallized by adding t-butyl methyl ether, to obtain 22.07 parts of the intended compound.

It was confirmed that this compound was 4-methylphenyldiphenylsulfonium 2,4,6-triisopropyl-3-nitrobenzenesulfonate by NMR ("GX-270" manufactured by JEOL Ltd.) and mass spectrometry (LC analyser is No. 1100 manufactured by HP, MASS analyser is LC/MSD manufactured by HP).

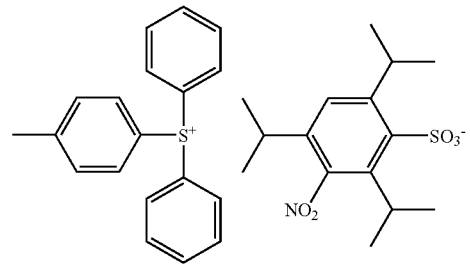

$^1$H-NMR (dimethyl sulfoxide-d, internal standard substance: tetramethylsilane): δ (ppm) 1.10–1.19 (m, 18H); 2.44 (s, 3H); 2.46–2.56 (m, 1H); 4.61–4.71 (m, 1H); 4.971 (br, 1H); 7.32 (s, 1H); 7.59–7.62 (m, 2H); 7.74–7.88 (m, 12H)

MS (ESI (+) Spectrum): M+ 277.0
MS (ESI (−) Spectrum): M− 328.2

ACID GENERATOR SYNTHESIS EXAMPLE 2

Synthesis of Acid Generator B2

2,4,6-Triisopropyl-3,5-dinitrobenzenesulfonic acid was used instead of 2,4,6-triisopropyl-3-nitrobenzenesulfonic acid in the acid generator synthesis example 1,4-methylphenyldiphenylsulfonium 2,4,6-triisopropyl-3,5-dinitrobenzenesulfonate was obtained. The structure thereof was confirmed by the same analysers as in the acid generator synthesis example 1.

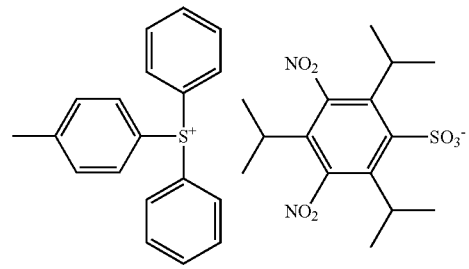

$^1$H-NMR (chloroform-d, internal standard substance: tetramethylsilane): δ (ppm) 1.22 (d, 6H, J=6.9 Hz); 2.23 (d, 6H, J=7.3 Hz); 2.47 (s, 3H); 2.47–2.83 (m, 1H); 4.85–4.95 (m, 2H); 7.47 (d, 2H, J=7.9 Hz); 7.62–7.77 (m, 12H)

MS (ESI (+) Spectrum): M+ 277.0
MS (ESI (−) Spectrum): M− 373.3

ACID GENERATOR SYNTHESIS EXAMPLE 3

Synthesis of Acid Generator B3

Di(4-tertbutylphenyl)iodonium chloride was used instead of p-tolyldiphenylsulfonium iodide in the acid generator synthesis example 1, the intended compound was obtained.

It was confirmed that this compound was di(4-tert-butylphenyl)iodonium 2,4,6-triisopropyl-3-nitrobenzenesulfonate by the same analysers as in the acid generator synthesis example 1.

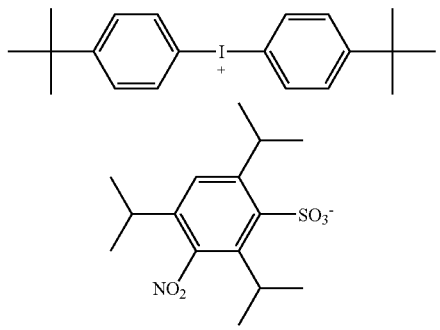

$^1$H-NMR (dimethyl sulfoxide-d, internal standard substance: tetramethylsilane): δ (ppm) 1.13–1.20 (m, 18H); 1.25 (s, 18H); 2.49–2.54 (m, 1H); 4.61–4.66 (m, 1H); 4.96 (br, 1H); 7.31 (s, 1H); 7.50–7.57 (m, 4H); 8.14–8.21 (m, 4H)

MS (ESI (+) Spectrum): M+ 393.0
MS (ESI (−) Spectrum): M− 328.2

RESIN SYNTHESIS EXAMPLE 1

Synthesis of Resin A1

2-Ethyl-2-adamantyl methacrylate, 3-hydroxy-1-adamantyl methacrylate and α-methacryloyloxy-γ-butyrolactone were charged at a molar ratio of 5:2.5:2.5 (20.0 parts:9.5 parts:7.3 parts), and methyl isobutyl ketone in twice weight based on all monomers was added, to prepare solution. To the solution was added azobisisobutyronitrile as an initiator in a ratio of 2 mol % based on all monomer molar amount, and the mixture was heated at 80° C. for about 8 hours. Then, the reaction solution was poured into large amount of heptane to cause precipitation, and this operation was repeated three times for purification. As a result, copolymer having a weight-average molecular weight of about 9,200 was obtained. This is called resin A1.

RESIN SYNTHESIS EXAMPLE 2

Synthesis of Resin A2

2-Ethyl-2-adamantyl methacrylate, 5-methacryloyloxy-2,6-norbornenelactone and α-methacryloyloxy-γ-butyrolactone were charged at a molar ratio of 2:1:1 (11.1 g:5.0 g:3.8 g), and 50 g of 1,4-dioxane was added, to prepare solution. To the solution was added 0.30 g of azobisisobutyronitrile as an initiator, and the mixture was heated to 85° C. and the mixture was stirred for 5 hours maintaining the temperature. Then, operation of pouring into large amount of n-heptane to cause crystallization was repeated three times for purification to obtain copolymer having a molecular weight of 9100 and a dispersion of 1.72. This is called resin A2.

Resist compositions were prepared using raw materials shown below in addition to the resins obtained in the above-mentioned resin synthesis examples, and evaluated.

<Acid Generator>
B1: 4-methylphenyldiphenylsulfonium 2,4,6-triisopropyl-3-nitrobenzenesulfonate
B2: 4-methylphenyldiphenylsulfonium 2,4,6-triisopropyl-3,5-dinitrobenzenesulfonate
B3: di(4-tert-butylphenyl)iodonium 2,4,6-triisopropyl-3-nitrobenzenesulfonate
C1: 4-methylphenyldiphenylsulfonium perfluorooctanesulfonate
C2: triphenylsulfonium triisopropylbenzenesulfonate <Quencher>
D1: 2,6-diisopropylaniline <Solvent>

| | |
|---|---|
| E1: propyleneglycol monomethyl ether acetate | 57 parts |
| γ-butyrolactone | 3 parts |
| E2: propyleneglycol monomethyl ether acetate | 26 parts |
| 2-heptanone | 26 parts |
| γ-butyrolactone | 3 parts |

EXAMPLE 1 AND COMPARATIVE EXAMPLE 1

The following components were mixed and dissolved, further, filtrated through a fluorine resin filter having pore diameter of 0.2 μm, to prepare resist liquid.
Resin (kind and amount are described in Table 1)
Acid generator (kind and amount are described in Table 1)
Quencher (kind and amount are described in Table 1)
Solvent (kind and amount are described in Table 1)

Silicon wafers were each coated with "ARC-29A-8", which is an organic anti-reflective coating composition available from Brewer Co., and then baked under the conditions: 215° C., 60 seconds, to form a 780 Å-thick organic anti-reflective coating. Each of the resist liquids prepared as above was spin-coated over the anti-reflective coating so that the thickness of the resulting film became 0.30 μm after drying. The silicon wafers thus coated with the respective resist liquids were each prebaked on a direct hotplate at temperature shown in "PB" column in Table 1 for 60 seconds. Using an ArF excimer stepper ("NSR ArF" manufactured by Nicon Corporation, NA=0.55, ⅔ Annular), each wafer thus formed with the respective resist film was subjected to line and space pattern exposure, with the exposure quantity being varied stepwise.

After the exposure, each wafer was subjected to post-exposure baking on a hotplate at temperature shown in "PEB" column in Table 1 for 60 seconds and then to paddle development for 60 seconds with an aqueous solution of 2.38 wt % tetramethylammonium hydroxide.

A bright field pattern developed on the organic anti-reflective coating substrate was observed with a scanning electron microscope, the results of which are shown in Table 2. The term "bright field pattern", as used herein, means a pattern obtained by exposure and development through a reticle comprising an outer frame made of a chromium layer (light-shielding layer) and linear chromium layers (light-shielding layers) formed on a glass surface (light-transmitting portion) extending inside the outer frame. Thus, the bright field pattern is such that, after exposure and development, resist layer surrounding the line and space pattern is removed while resist layer corresponding to the outer frame is left on the outer side of the region from which the resist layer is removed.

Effective sensitivity: It is expressed as the amount of exposure that the line pattern (light-shielding layer) and the space pattern (light-transmitting layer) become 1:1 after exposure through the 0.13 μm line and space pattern mask and development.

Resolution: It is expressed as the minimum size of space pattern which gave the space pattern split by the line pattern at the exposure amount of the effective sensitivity.

Smoothness of pattern wall surface: A wall surface of isolated line pattern was observed by a scanning electron microscope, and when smoother than in Comparative Examples 1 and 2, judge is ○, and when there is no change, judge is x.

TABLE 1

| Example No. | Resin (Parts) | Acid generator (Part) | Quencher (Part) | Solvent | PB | PEB |
|---|---|---|---|---|---|---|
| Example 1 | A1/10 | B1/0.22 | D1/0.015 | E1 | 130° C. | 140° C. |
| Example 2 | A1/10 | B1/0.22 | D1/0.0075 | E1 | 130° C. | 140° C. |
| Example 3 | A1/10 | B1/0.27 | D1/0.015 | E1 | 130° C. | 140° C. |
| Example 4 | A2/10 | B1/0.22 | D1/0.0075 | E2 | 130° C. | 130° C. |
| Example 5 | A1/10 | B2/0.24 | D1/0.0075 | E1 | 140° C. | 125° C. |
| Example 6 | A2/10 | B2/0.24 | D1/0.0075 | E2 | 140° C. | 125° C. |
| Example 7 | A2/10 | B3/0.26 | D1/0.0075 | E2 | 130° C. | 130° C. |
| Comparative example 1 | A1/10 | C1/0.35 | D1/0.027 | E1 | 130° C. | 130° C. |
| Comparative example 2 | A2/10 | C1/0.3 | D1/0.023 | E2 | 130° C. | 130° C. |
| Comparative example 3 | A2/10 | C2/0.2 | D1/0.0075 | E2 | 150° C. | 140° C. |

TABLE 2

| Example No. | Effective Sensitivity (mJ/cm2) | Resolution (μm) | Smoothness of pattern wall surface |
|---|---|---|---|
| Example 1 | 38 | 0.12 | ○ |
| Example 2 | 24 | 0.12 | ○ |
| Example 3 | 33 | 0.12 | ○ |
| Example 4 | 34 | 0.12 | ○ |
| Example 5 | 23 | 0.12 | ○ |
| Example 6 | 43 | 0.12 | ○ |
| Example 7 | 67 | 0.12 | ○ |
| Comparative example 1 | 33 | 0.12 | — |
| Comparative example 2 | 35 | 0.12 | — |
| Comparative example 3 | 32 | 0.13 | — |

The sulfonate of the present invention is energy-active, and can be suitably used as a component in a resist. The chemical amplification type positive resist composition of the present invention gives resist patterns having remarkably improved line edge roughness, and also provides excellent resist abilities such as dry etching resistance, sensitivity, resolution and the like. Therefore, it is suitable for excimer laser lithography using ArF, KrF and the like, has large industrial values.

What is claimed is:

1. A chemical amplification positive resist composition comprising a sulfonate of the formula (III') or (VI')

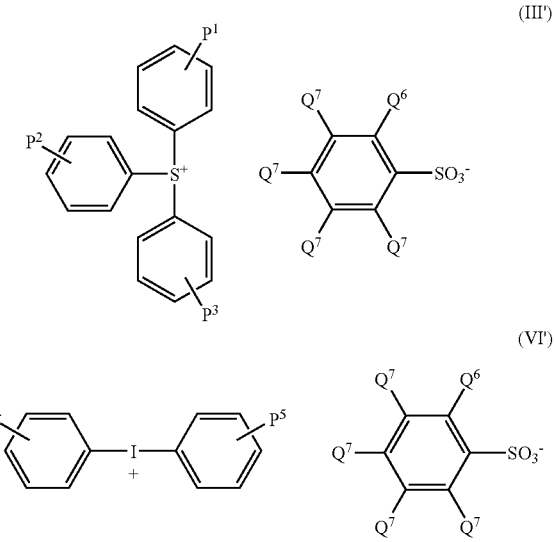

wherein $Q^6$, $Q^7$, $Q^8$, $Q^9$ and $Q^{10}$ each independently represent hydrogen, an alkyl having 1 to 16 carbon atoms, an alkoxy having 1 to 16 carbon atoms, or electron attractive group, with the proviso that at least one of $Q^6$, $Q^7$, $Q^8$, $Q^9$ and $Q^{10}$ represents alkyl having 3 to 16 carbon atoms, and at least one of $Q^6$, $Q^7$, $Q^8$, $Q^9$ and $Q^{10}$ is a nitro group, $P^1$, $P^2$ and $P^3$ each independently represent hydrogen, hydroxyl, an alkyl having 1 to 6 carbon atoms or an alkoxy having 1 to 6 carbon atoms, and $P^4$ and $P^5$ each independently represent hydrogen, hydroxyl, an alkyl having 1 to 6 carbons atoms or an alkoxy having 1 to 6 carbon atoms, and resin which contains a structural unit having an acid labile group and which itself is insoluble or poorly soluble in an alkali aqueous solution but becomes soluble in an alkali aqueous solution by the action of an acid, wherein the structural unit having an acid-labile group is a structural unit derived from 2-alkyl-2-adamantyl (meth)acrylate or 1-(1-adamantyl)-1-alkylalkyl(meth) acrylate.

2. The composition according to claim 1, wherein the content of the structural unit having an acid-labile group in all structural units of the resin is from 10 to 80% by mol.

3. The composition according to claim 2, wherein the resin further contains a structural unit derived from 2-norbornene and a structural unit derived from an aliphatic unsaturated dicarboxylic anhydride.

4. The composition according to claim 1, wherein the resin contains, in addition to the structural unit having an acid-labile group, further at least one structural unit selected from the group consisting of a structural unit derived from p-hydroxystyrene, a structural unit derived from m-hydroxystyrene, a structural unit derived from 3-hydroxy-1-adamantyl(meth)acrylate, a structural unit derived from 3,5-dihydroxy-1-adamantyl(meth)acrylate, a structural unit derived from (meth)acryloyloxy-γ-butyrolactone having a lactone ring optionally substituted by alkyl, a structural unit of the formula (VIIa) and a structural unit of the following formula (VIIb)

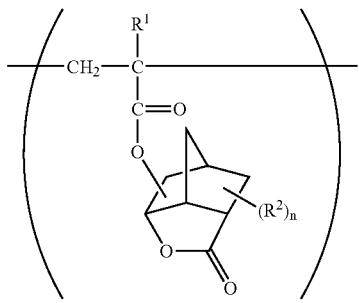

(VIIa)

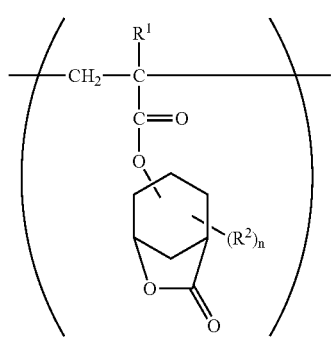

(VIIb)

wherein $R^1$ and $R^2$ each independently represent hydrogen, methyl or trifluoromethyl, and n represents an integer of 1 to 3.

5. The composition according to claim 1, wherein the composition further comprises basic nitrogen-containing organic compound as a quencher.

6. The composition according to claim 1, wherein the composition further comprises a surfactant.

7. A sulfonate of the formula (IIIb):

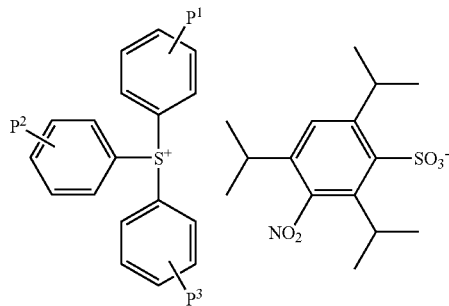

(IIIb)

wherein $P^1$, $P^2$ and $P^3$ each independently represent hydrogen, hydroxyl, an alkyl having 1 to 6 carbon atoms or an alkoxy having 1 to 6 carbon atoms.

8. The sulfonate according to claim 7, wherein $P^1$ and $P^3$ are hydrogen and $P^2$ is 4-methyl.

9. A sulfonate of the following formula (IIId):

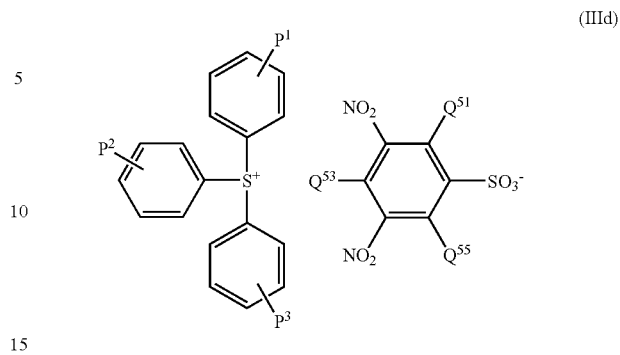

(IIId)

wherein $Q^{51}$, $Q^{53}$ and $Q^{55}$ each independently represent hydrogen, an alkyl having 1 to 16 carbon atoms, an alkoxy having 1 to 16 carbon atoms, or an electron attractive group, with the proviso that at least one of $Q^{51}$, $Q^{53}$ and $Q^{55}$ represents an alkyl having 3 to 16 carbon atoms, and $P^1$, $P^2$ and $P^3$ each independently represent hydrogen, hydroxyl, an alkyl having 1 to 6 carbon atoms or an alkoxy having 1 to 6 carbon atoms.

10. The sulfonate according to claim 9, wherein the sulfonate is a sulfonate of the formula (IIIe):

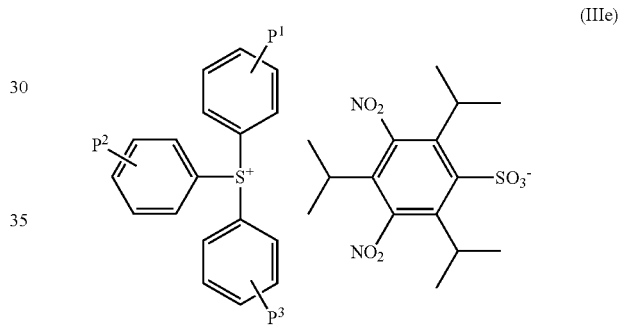

(IIIe)

wherein $P^1$, $P^2$ and $P^3$ each independently represent hydrogen, hydroxyl, an alkyl having 1 to 6 carbon atoms or an alkoxy having 1 to 6 carbon atoms.

11. The sulfonate according to claim 10, wherein $P^1$ and $P^3$ are hydrogen and $P^2$ is 4-methyl.

12. A sulfonate of the formula (VIb):

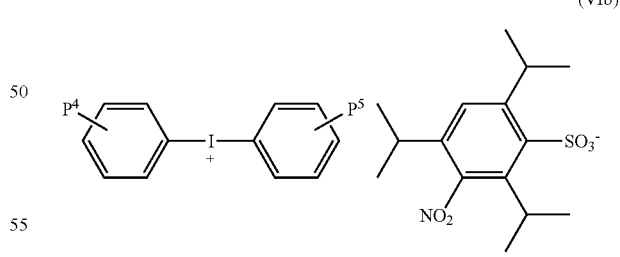

(VIb)

wherein $P^4$ and $P^5$ each independently represent hydrogen, hydroxyl, an alkyl having 1 to 6 carbon atoms or an alkoxy having 1 to 6 carbon atoms.

13. The sulfonate according to claim 12, wherein $P^4$ and $P^5$ are 4-tert-butyl.

* * * * *